(12) United States Patent
Sasaki

(10) Patent No.: US 6,529,039 B2
(45) Date of Patent: Mar. 4, 2003

(54) SEMICONDUCTOR DEVICE

(75) Inventor: Kou Sasaki, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/851,472

(22) Filed: May 4, 2001

(65) Prior Publication Data

US 2001/0040465 A1 Nov. 15, 2001

(30) Foreign Application Priority Data

May 11, 2000 (JP) ........................................ 2000-138064

(51) Int. Cl.[7] .......................................... H03K 19/177
(52) U.S. Cl. .......................................... 326/38; 326/40
(58) Field of Search .................................... 326/37–41

(56) References Cited

U.S. PATENT DOCUMENTS

| | | | | |
|---|---|---|---|---|
| 5,231,312 A | * | 7/1993 | Gongwer et al. | 326/41 |
| 5,455,525 A | * | 10/1995 | Ho et al. | 326/41 |
| 5,701,091 A | * | 12/1997 | Kean | 326/41 |
| 5,748,009 A | * | 5/1998 | Bertolet et al. | 326/41 |
| 5,903,165 A | * | 5/1999 | Jones et al. | 326/41 |
| 5,905,385 A | * | 5/1999 | Sharpe-Geilser | 326/41 |

FOREIGN PATENT DOCUMENTS

| | | | | |
|---|---|---|---|---|
| JP | 6-140566 | 5/1994 | | H01L/27/04 |

* cited by examiner

*Primary Examiner*—Don Le
(74) *Attorney, Agent, or Firm*—Hayes Soloway P.C.

(57) ABSTRACT

Input terminals "an", "aw", "as", and "ae" having an identical function and output terminals "bn", "bw", "bs", "be" having an identical function are arranged at the respective sides of, a macro cell 1. The input terminals "an", "aw", "as", and "ae" are connected to the input terminals of a NOR circuit 12 and an output from the NOR circuit 12 is supplied to the input terminal "a" of an internal kernel circuit 11. The input terminal to be used is connected by a wire. The other input terminals not to be used are connected to a potential of logical 0 (ground potential). Output buffers 14, 15, 16, and 17 are arranged for the output terminals "bn", "bw", "bs", and "be". A connection wire is provided only for the output terminal to be used. Thus, it is possible to increase the degree of freedom of the macro designing. By isolating the wires to the respective terminals from one another, it is possible to reduce the wire delay, thereby enabling to obtain a high-speed operation.

14 Claims, 18 Drawing Sheets

(a)

(b)

(c)

(d)

SEMICONDUCTOR DEVICE

BACKGROUND OF THE INVENTION

1. Field of the Invention

The present invention relates to a semiconductor device preferable for realizing a large-scale function system on a single chip and in particular, to a semiconductor device having terminals of an identical function at a plurality of sides of a macro cell, so that these terminals can selectively be used.

2. Description of the Related Art

It is known to combine logic properties whose operations have been verified, so as to constitute a functional system on a single chip. For example, by arranging (layout) macro cells such as an MPU and a DSP and various macro cells such as a memory and various I/O interfaces on a chip and connecting the macro cells by wiring, it is possible to realize a so-called system LSI having various functions dedicated to a particular use.

FIG. 15 shows a configuration of a macro cell designed for a single chip and used as a single chip. In FIG. 15, a reference symbol 100 denotes a chip (single chip), 101 to 164 denote pads (external electrodes), and 200 denotes a macro cell formed on the chip. The pads 101 to 104 are located at positions considering the pin arrangement of a package (containing a semiconductor chip) (not depicted). Here is given an example in which a first output pad 101 is arranged at the left side of the chip 100, a second output pad 102 is arranged at the lower side a third output pad 103 is arranged at the right side, and an input pad 104 is arranged at the upper side.

The macro cell 200 includes: an internal kernel circuit block 300 performing a predetermined functional operations; three output buffers 210, 220, and 230; an input buffer 240; three output terminals 201, 202, and 203; and an input terminal 204. The internal kernel circuit block 300 has a circuit portion (not depicted) performing a predetermined functional operation according to an input signal and terminals 301 to 304.

The terminals 201 to 204 for connecting the macro cells are designed considering the arrangement of the pads 101 to 104. The input terminal 204 is arranged at the upper side of the macro cell 200 and the output terminals 201, 202, and 203 are arranged at the left side, the lower side, and the right side, respectively. The pads 101 to 104 are connected to the terminals 201 to 204 of the macro cell 200 by the macro external wires 111 to 114. The terminal arrangement of the internal kernel circuit block 300 is designed considering the arrangement of the terminals (for connecting the macro cells) of the macro cell 200. An input terminal 304 is arranged at the upper side of the internal kernel circuit block 300, and a first, a second, and a third output terminal 301, 302, and 303 are arranged at the left side, at the lower side, and at the right side of the internal kernel circuit block 300.

An input buffer 240 is arranged between the input terminal 204 of the macro cell 200 and the input terminal 304 of the internal kernel circuit block 300, and the input terminal 204 of the macro cell 200 is connected to the input terminal of the input buffer 240 by an in-macro wire while the output terminal of the input buffer 240 is connected to the input terminal 304 of the internal kernel circuit block 300 by an in-macro wire. A first output buffer 210 is arranged between the first output terminal 301 of the internal kernel circuit block 300 and the first output terminal 201 of the macro cell 200, and the first output terminal 301 of the internal kernel circuit block 300 is connected to the input terminal of the first output buffer 210 by an in-macro wire while the output terminal of the first output buffer 210 is connected to the first output terminal 201 of the macro cell 200 by an in-macro wire. Similarly, via the second and the third output buffers 220 and 230, the output terminals 302 and 303 of the internal kernel circuit block 300 are connected to the output terminals 202 and 203 of the macro cell.

In FIG. 15, the respective terminals are located so as to minimize the wires outside and inside the macro cell. This reduces a signal transfer delay caused by wiring, thereby enabling to obtain a high-speed operation.

FIG. 16 shows a combination of a macro chip designed for a single chip and a macro chip designed for a logic core. FIG. 16 shows.a configuration example having the macro cell 200 (designed for a single chip) shown in FIG. 15 arranged together with another macro cell (designed for the IP) located below the macro cell 200. The macro cell 400 includes input terminals W, X, and Y via which output signals of the macro cell 200 are fed, and an output terminal Z for outputting a signal (input signal to the macro cell 200) supplied to the macro 200. Here, the terminals W, X, Y and Z are arranged at the upper side of the macro cell 400.

When the macro cell 200 designed as a single chip is used as it is in combination with the macro cell 400 for the logic arranged below the macro cell 200, a macro-connecting wire 501 between the first output terminal 201 and the first input terminal W needs to be quite long. When the wire becomes longer, the wire capacity is increased, causing a delay in signal transfer. To cope with this, a buffer 510 is arranged in the route of the macro-connecting wire 501, so as to reduce the signal transfer delay. A macro-connecting wire 502 between the second output terminal 201 and the second input terminal X is short, and they are connected to each other directly without providing a buffer. A macro-connecting wire 503 between the third output terminal 203 and the second input terminal Y is long, and they are connected to each other via a buffer. A macro-connecting wire 504 between the output terminal Z and the input terminal 204 is further longer, and they are connected to each other via two buffers arranged at a certain interval.

FIG. 17 shows a configuration example of using a macro cell designed for the logic core in combination with another macro cell designed for the logic core. The macro cell 600 shown in FIG. 17 is identical to the internal kernel circuit block 300 shown in FIG. 15 and FIG. 16 and has a functional operation identical to that of the macro cell 200 shown in FIG. 15 and FIG. 16. In this macro cell 600, the terminals W, X, Y, and Z are arranged at the lower side considering a connection with the other macro cell 400 arranged below. Since locations of the terminals W, X, Y, and Z are changed, the location of the input buffer 240 and the in-macro wiring are different from the macro cell 200 shown in FIG. 15 and FIG. 16. By using the macro cell 600 having such a terminal arrangement, it is possible to reduce the macro-connecting wires 511 to 514.

FIG. 18 shows a configuration example for realizing a single chip by using a macro cell designed for the logic core. When utilizing the macro cell (designed for the logic core) 600 shown in FIG. 17 to constitute a chip having the pad arrangement shown in FIG. 15, it is necessary to use long wires between the terminals w, y, z arranged at the lower side of the macro cell 600 and the pads 101, 103, and 104. To cope with this, an output buffer 710 is arranged in the wire between the terminal w and the pad 101, and an output buffer

720 is arranged in the wire between the terminal y and the pad 103. Furthermore, in the wire between the pad 104 and the terminal z, there are arranged input buffers 730 and 740 at a certain interval. This reduces the delay in signal transfer caused by increase of the wire capacity.

Japanese Patent Publication 6-140566 discloses a semiconductor integrated circuit having a plurality of mega macro cells having terminals connected to one another by macro external wires, wherein identical terminals are arranged at the four sides of the mega macro cell and are electrically connected to one another, thereby improving the wiring efficiency. Since identical terminals are arranged at the four sides of the mega macro cell, it is possible to connect mega macro cells by connecting terminals of the opposing sides of the adjacent macro cells.

As shown in FIG. 16, when connecting a macro cell designed for a single chip (having terminals distributed to the respective sides) to another macro cell, the wire between the macro cells may be quite long, which increases the signal transfer delay time. Although it is possible to suppress the signal transfer delay by providing a buffer in the wire route, the signal transfer is delayed according to the wire length.

As shown in FIG. 18, when utilizing a macro cell designed for the logic core (having terminals arranged at particular sides) to constitute a single chip, a long wire is required between the macro terminals and the external terminals (pads) of the chip, causing a problem of the signal delay.

As shown in FIG. 17, by arranging macro cells in such a manner that sides having terminals oppose to each other, it is possible to reduce the length of the macro-connecting wire. However, it is often difficult to arrange a plenty of macro cells in this way.

When identical terminals are arranged at the respective sides of a macro cell, it is possible to increase the flexibility of the macro cell layout (floor plan). However, when the terminals arranged at the respective sides are connected to one another, the total wire length is increased, which in turn increases the signal transfer delay time.

SUMMARY OF THE INVENTION

It is therefore an object of the present invention to provide a semiconductor device capable of increasing the flexibility of the macro cell layout (floor plan) and reducing the delay caused by wires. Another object of the present invention is to provide a semiconductor device which can be used both for the single chip and the logic core. Still another object of the present invention is to provide a semiconductor device in which terminals having an identical function and arranged at a plurality of sides of the macro cell can be selectively used by an external signal.

In order to achieve the aforementioned object, the semiconductor device according to the present invention includes terminals having an identical function at least at two sides of a macro cell and a terminal selector for selecting at least one of the terminals having the identical function.

Since terminals having an identical function are arranged at the respective sides of a macro cell, it is possible to obtain a high degree of freedom in the macro arrangement designing (floor plan). By using terminals in the vicinity of the connection destination, it is possible to reduce the macro-connecting wire. Since the terminal selector is provided, it is possible to make a connection to the kernel circuit in the macro cell by using only the terminal to be used. Moreover, since the terminal selector is provided, it is possible to isolate the wires to the respective terminals from one another. This enables to reduce the signal delay by wiring and obtain a high-speed operation. It should be noted that by selecting a terminal to be used, this can be used for both as a macro cell for a single chip and as a macro cell for a logic core.

When the terminals having an identical function are input terminals, the terminal selector is composed of an AND circuit and an OR circuit. When the AND circuit is used, the input terminals not to be used are fixed to logical 1. When the OR circuit is used, the input terminals not to be used are fixed to logical 0. Thus, the signal of the input terminal to be used is supplied via the AND circuit to the input terminal of the kernel circuit. It should be noted that when the AND circuit is used, its input terminals are pulled up and when the OR circuit is used, its input terminals are pulled down. When pull up or pull down is performed, wiring is performed only to the input terminal to be used.

When the terminals having an identical function are output terminals, a buffer circuit is provided for each of the output terminals. Thus, it is possible to isolate the wires to the respective output terminals from one another, thereby enabling to reduce the signal delay by wiring and obtain a high-speed operation. Since the same signals output to the plurality of output terminals having an identical function, wiring is required only for the output terminal to be used. It should be noted that by connecting a plurality of output terminals in parallel to one another, it is possible to increase the output drive capability. It should be noted that it is also possible to provide a tri-state buffer circuit for each of the output terminals. When the tri-state buffer circuit is used, it is possible to control the output terminals not to be used, in a non-output state (high impedance). This can reduce the power for driving the wire to the output terminal not to be used.

According to another aspect of the present invention, the semiconductor device includes terminals having an identical function at least at two sides of a macro cell and a terminal changer for changing at least one of the terminals having the identical function according to a terminal specifying data.

Since terminals having an identical function are arranged at the respective sides of the macro cell, it is possible to obtain a high degree of freedom in macro arrangement designing (floor plan). By using a terminal in the vicinity of the terminal as the connection destination, it is possible to reduce the macro-connecting wire. Since the terminal changer is provided, it is possible to change the terminal to be used after the wire connection. Accordingly, after manufacturing a semiconductor device having a plurality of wire routes of the same signal, it is possible to select an optimal wire route. Moreover, it is possible to supply a test signal to a particular terminal and select that terminal, thereby performing a macro operation test.

It should be noted that the terminal specifying data is a parae data, which is latched by a data latch circuit provided in the macro cell, so that an input terminal and an output terminal are selected according to the output of the latch. Moreover, it is also possible to supply the terminal specifying data as a serial data to the shift register provided in the macro cell, so that an input terminal and an output terminal are selected according to the output of the shift register. By supplying the terminal specifying data, it is possible to specify an input terminal and an output terminal to be used. When the terminal specifying data is a serial data, it is possible to reduce the number of terminals for supplying the terminal specifying data. Furthermore, by supplying the output of the final stage of the shift register to the serial data input terminal of another macro cell, it is possible to select/specify a terminal to be used for the other macro cell.

BRIEF DESCRIPTION OF THE DRAWINGS

FIG. 6(a) shows a first example; FIG. 6(b) shows a second example; FIG. 6(c) shows a third example; and FIG. 6(d) shows a fourth example.

DESCRIPTION OF THE PREFERRED EMBODIMENTS

Figure 1:
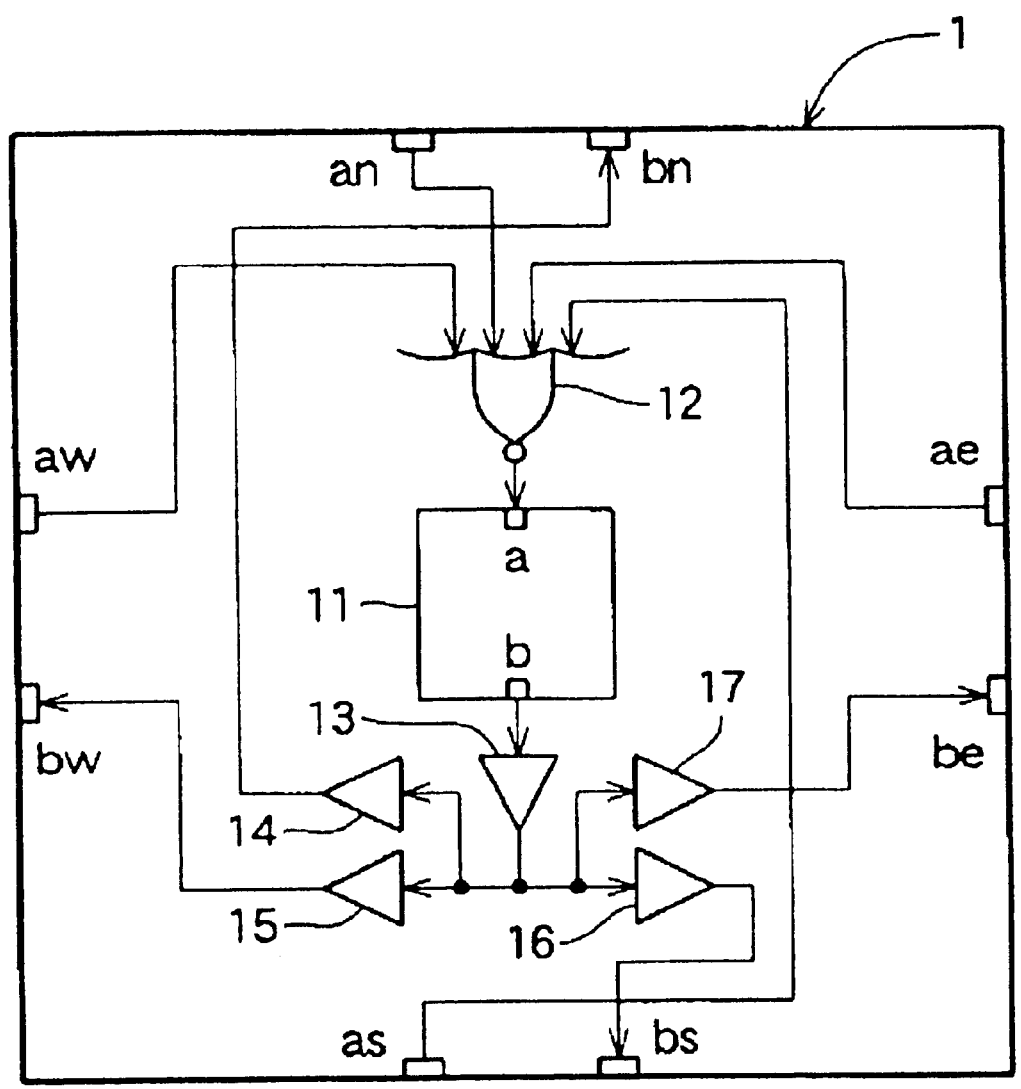
FIG. 1 shows a configuration of a semiconductor device (macro cell) according to a first embodiment of the present invention.

Description will now be directed to preferred embodiments of the present invention with reference to the attached drawings. FIG. 1 shows a configuration of a semiconductor device (macro cell) according to a first embodiment of the present invention. The macro cell shown in FIG. 1 includes an internal kernel circuit 11, a NOR circuit 12 constituting input terminal selecting means, five buffer circuits 13 to 17, four input terminals "an", "aw", "as", "ae" and four output terminals "bn", "bw", "bs", "be". A reference symbol "a" denotes an input terminal of the internal kernel circuit 11 and "b" denotes an output terminal of the internal kernel circuit 11.

The input terminals an, aw, as, ae and the output terminals bn, bw, bs, be are arranged on different sides of the macro cell 1. In this embodiment, the input terminal "an" and the output terminal "bn" are arranged on the upper side of the macro cell 1, the input terminal "aw" and the output terminal "bw" are arranged at the left side of the macro cell 1, the input terminal "as" and the output terminal "bs" are arranged at the lower side of the macro cell 1, and the input terminal "ae" and the output terminal "be" are arranged at the right side of the macro cell 1.

The NOR circuit 12 has four input terminals and one output terminal. The input terminals an, aw, as, ae are respectively connected to the input terminals of the NOR circuit 12. The output terminal of the NOR circuit 12 is connected to the input terminal A of the internal kernel circuit 11. The output terminal B of the internal kernel circuit 11 is connected to the input terminal of the buffer circuit 13. The buffer circuit 13 has output terminals respectively connected to input terminals of buffer circuits 14 to 17 arranged corresponding to the output terminals bn, bw, bs, and be. The buffer circuit 14 has an output terminal connected to the output terminal bn arranged at the upper side of the macro cell 1. Similarly, the buffer circuits 15, 16, and 17 has their output terminals respectively connected to the output terminals bw, bs, and be arranged at the left side, at the lower side, and at the right side of the macro cell 1, respectively.

With the aforementioned configuration, in the macro cell 1 shown in FIG. 1, by fixing reserved input terminals to logical 0, it is possible to supply a signal to the input terminal A of the internal kernel circuit 11 from an arbitrary side. For example, when using the input terminal "an" at the upper side, the other input terminals aw, as and ae are fixed to logical 0. The fixing to logical 0 can be performed by connecting the input terminals to the ground (or negative power source). When three of the four inputs are logical 0, the NOR circuit 12 generates an output in which the logic of the remaining one input is reversed. Accordingly, in this case, the logical level of the input signal supplied to the input terminal "an" at the upper side is reversed and fed to the input terminal "a" of the internal kernel circuit 11.

Since the macro cell 1 supplies the output of the internal kernel circuit 11 to all the output terminals bn, bw, bs, and be via the buffer circuits 13 to 17, it is possible to take out an output from any of the output terminals bn, bw, bs, and be. The output terminals not used may be left open (unconnected).

Figure 2:
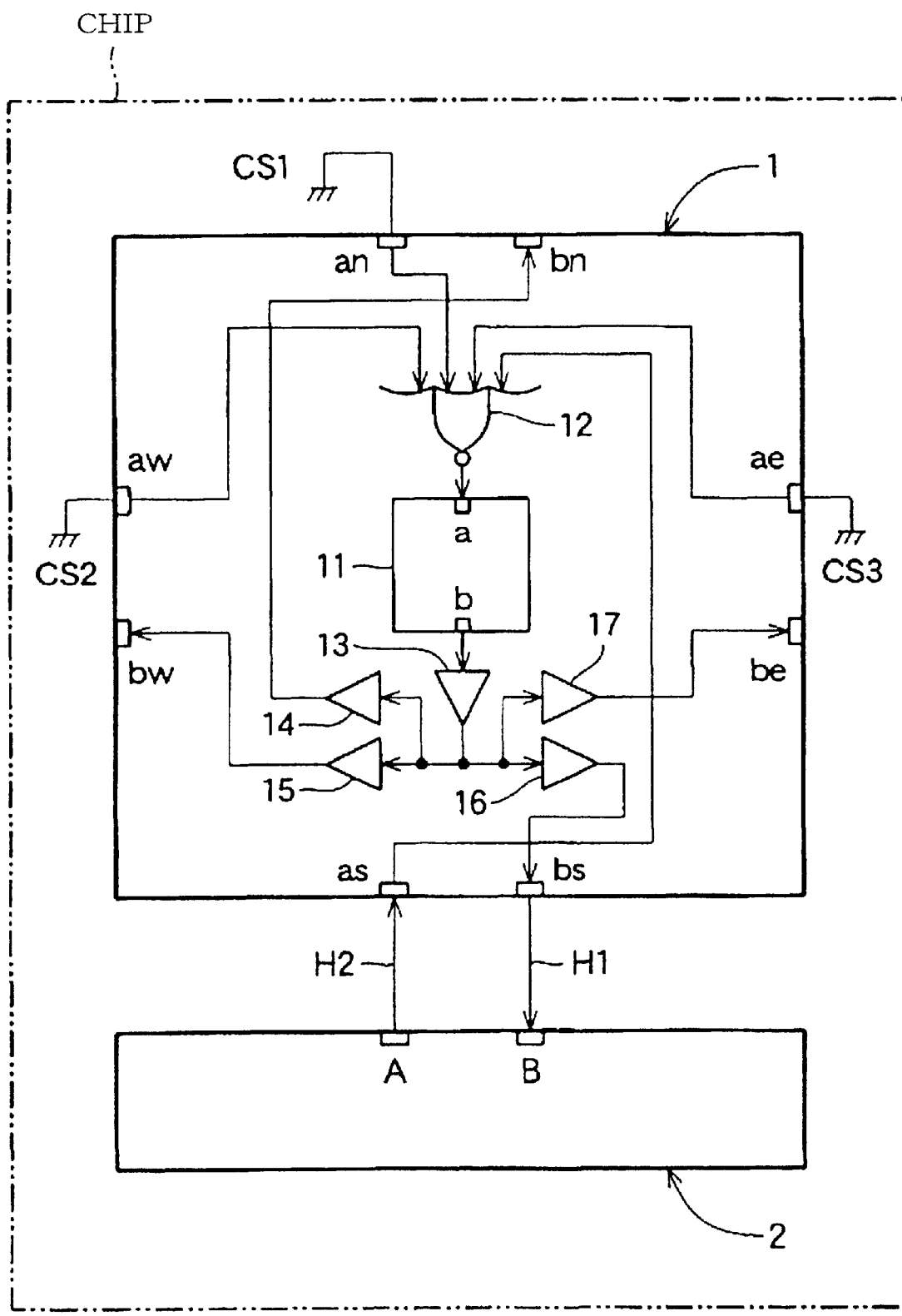
FIG. 2 shows a configuration of a chip using the macro cell shown in FIG. 1 in combination with another macro cell.

FIG. 2 shows a chip configuration using the macro cell shown in FIG. 1 in combination with another macro cell 2. FIG. 2 shows an example in which the other macro cell 2 is located below the macro cell 1. The reference symbol A denotes an output terminal of the other macro cell 2 and B denotes an input terminal of the other macro cell 2. In such a macro cell arrangement, by using the terminals "as" and "bs" arranged at the lower side of the macro cell 1, it is possible to minimize the macro-connecting wire and minimize the wire delay. Accordingly, the output terminal "bs" at the lower side of the macro cell 1 is connected to the input terminal B of the macro cell 2 by a macro-connecting wire H1 while the input terminal "as" at the lower side of the macro cell 1 is connected to the output terminal A of the macro cell 2 by a macro-connecting wire H2. The input terminals "an", "aw", and "ae" at the upper side, at the left side, and at the right side which are not used are connected to clamp cells CS1, CS2, and CS3, so as to fix the input terminals "an", "aw", and "ae" to logical 0.

To the terminal names of the macro cell 1 at the upper side, at the left side, at the lower side, and at the right side, reference symbols "n", "w", "s", and "e" are attached, respectively. Thus, the terminal names themselves can identify the terminal positions.

A circuit designer creates a circuit using the macro cell 1 by tentatively determining one of the plurality of terminals on the macro cell 1 having an identical function and creating a circuit diagram or a net list, and hands over data to a layout designer.

In the example shown in FIG. 2, the macro cell 1 is arranged in the same direction as the one shown in FIG. 1 (without rotating the macro cell shown in FIG. 1). The other macro cell 2 is arranged below the macro cell 1 in a floor plan. The layout designer instructs the circuit designer to use the terminal having the terminal name containing the symbol (extender) indicating the lower side uses the terminal at the lower side of the macro cell 1 because the terminal at the lower side of the macro cell 1 is used. According to this instruction, the circuit designer clamps the unnecessary input terminals "an", "aw", and "ae" to logical 0 and connects the input terminal "as" to be used, to the output terminal A of the macro cell 2. Moreover, the output terminals "bn", "bw", and "be" not to be used are opened (disconnected) and the output terminal "bs" to be used is connected to the input terminal B of the other macro cell 2.

The input signal supplied to the input terminal "as" is supplied via the NOR circuit 12 to the input terminal "all of the internal kernel circuit 11. Since the terminals "an", "aw", and "ae" not used are fixed to logical 0, the input signal supplied to the input terminal "as" is logically reversed by the NOR circuit 12 before supplied to the input terminal "a" of the internal kernel circuit 11. If the input terminal "as" is logical 0, then logical 1 is supplied to the input terminal "a" of the internal kernel circuit 11.

Even if the output terminal is opened, no problem arises such as generation of through current due to input potential fluctuation like an input terminal. Accordingly, the terminals not to be used are opened and only the terminal to be used is connected, thereby enabling to select a terminal.

Since as the input terminal and the output terminal to be used are selected the terminals "as" and "bs" at the lower side corresponding to the other macro cell 2, no detour wiring is required for connection between the macro cell 1 and the other macro cell 2.

Thus, by arranging terminals having an identical function at the respective sides of the macro cell 1, it is possible to select a terminal in the vicinity of the other macro cell 2. This reduces the macro-connecting wire and reduces the signal delay due to wiring, thereby realizing a semiconductor device capable of a high-speed circuit operation.

The input terminals not to be used need only to be fixed to a predetermined logical level and the output terminals to be used need only to be opened. Accordingly, no signal line is required for selecting an input terminal and an output terminal. Because a logical circuit (gate circuit) of a multi-input one-output configuration is used as the input terminal selector, the input terminal not used may also serve as an input terminal selection controller. Accordingly, it is possible to provide a semiconductor device of a further reduced area.

Moreover, when one output is supplied to a plurality of macro cells, the output terminal located in the vicinity of the other macro cells can be used so as to reduce the macro-connecting wire length. For example, when all of the terminals "bn", "bw", "bs", and "be" located at the four sides are used, it is possible to output the same output signal (the same data) in four directions. Since buffer circuits 14, 15, 16, and 17 are provided for the respective output terminals "bn", "bw", "bs", and "be", the output drive capacity is not lowered even when a plurality of output terminals are used.

Figure 3:
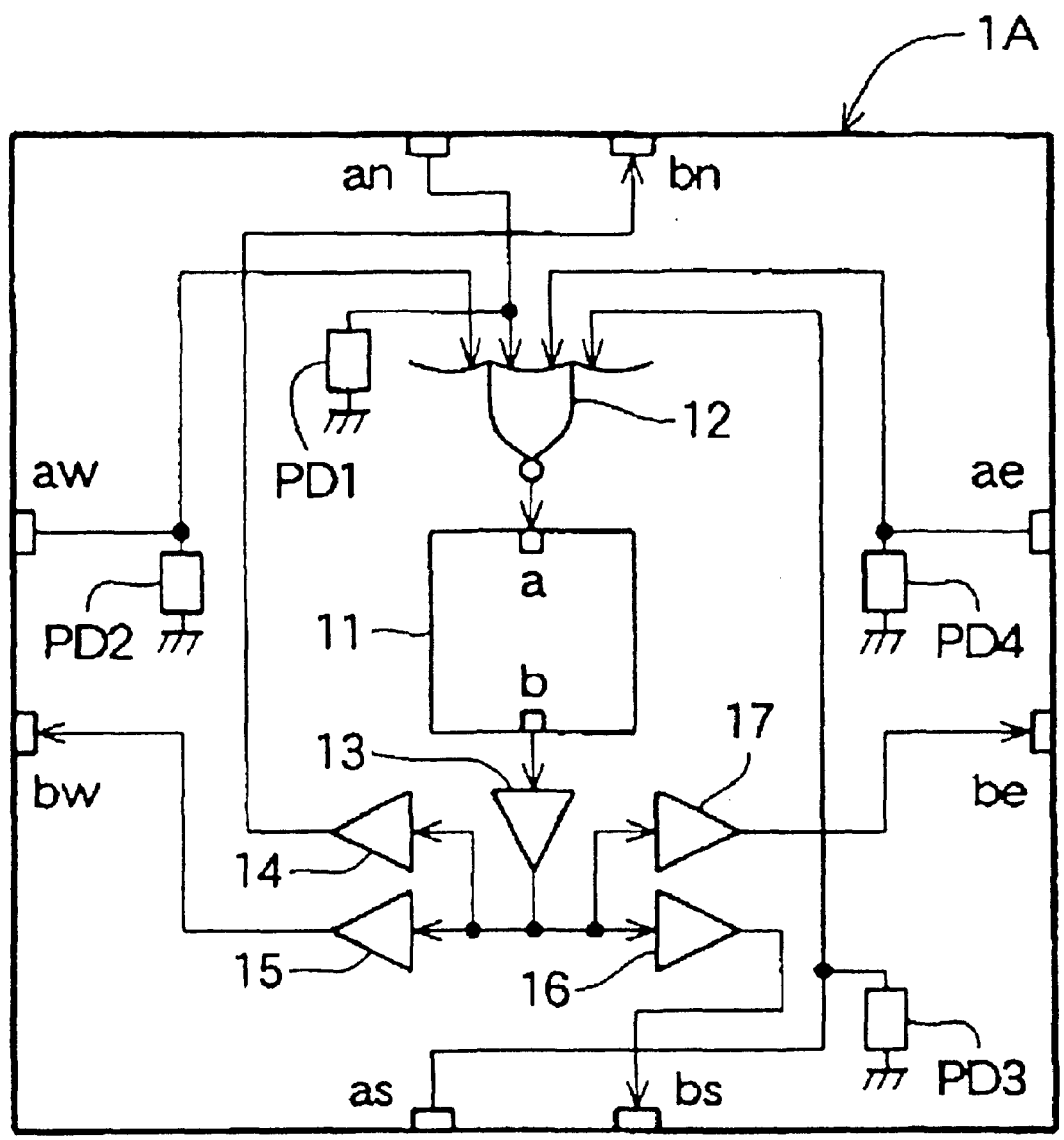
FIG. 3 shows a configuration of a semiconductor device (macro cell) according to a second embodiment of the present invention.

FIG. 3 shows a configuration of a semiconductor device (macro cell) according to a second embodiment of the present invention. In the macro cell 1A shown in FIG. 3, the input terminals of the NOR circuit constituting the input terminal selector are pulled down via respective pull-down elements PD1, PD2, PD3, and PD4. The pull-down elements PD1, PD2, PD3, and PD4 are made by using CMOS transistors for active load and resistors. By arranging the pull-down elements PD1, PD2, PD3, and PD4 in the macro cell 1A and pulling down the input terminals "an", "aw", "as", and "ae", the input terminals not to be used may not be fixed to logical 0. Accordingly, only the terminal to be used requires the macro-connecting wire and a connection wire to an external terminal.

In the macro cell 1 shown in FIG. 1 and in the macro cell 1A shown in FIG. 3, the NOR circuit 12 is used to constitute the input terminal selector. However, the NOR circuit 12 may be replaced by an OR circuit. When the OR circuit is used, the signal supplied to the input terminal of the macro cell is supplied to the input terminal of the internal kernel circuit 11 without reversing its logical level. In general, the OR circuit has an internal circuit configuration in which the number of elements stages serving as the longitudinal connection is increased as compared to the NOR circuit 12. Accordingly, when the OR circuit is used, the gate delay time is increased as compared when the NOR circuit 12 is used. Accordingly, when the OR circuit is used, the gate delay time is increase as compared when the NOR circuit 12 is used.

The input terminal selector may also be constituted by using a NAND or AND circuit instead of the NOR circuit and the OR circuit.

Figure 4:
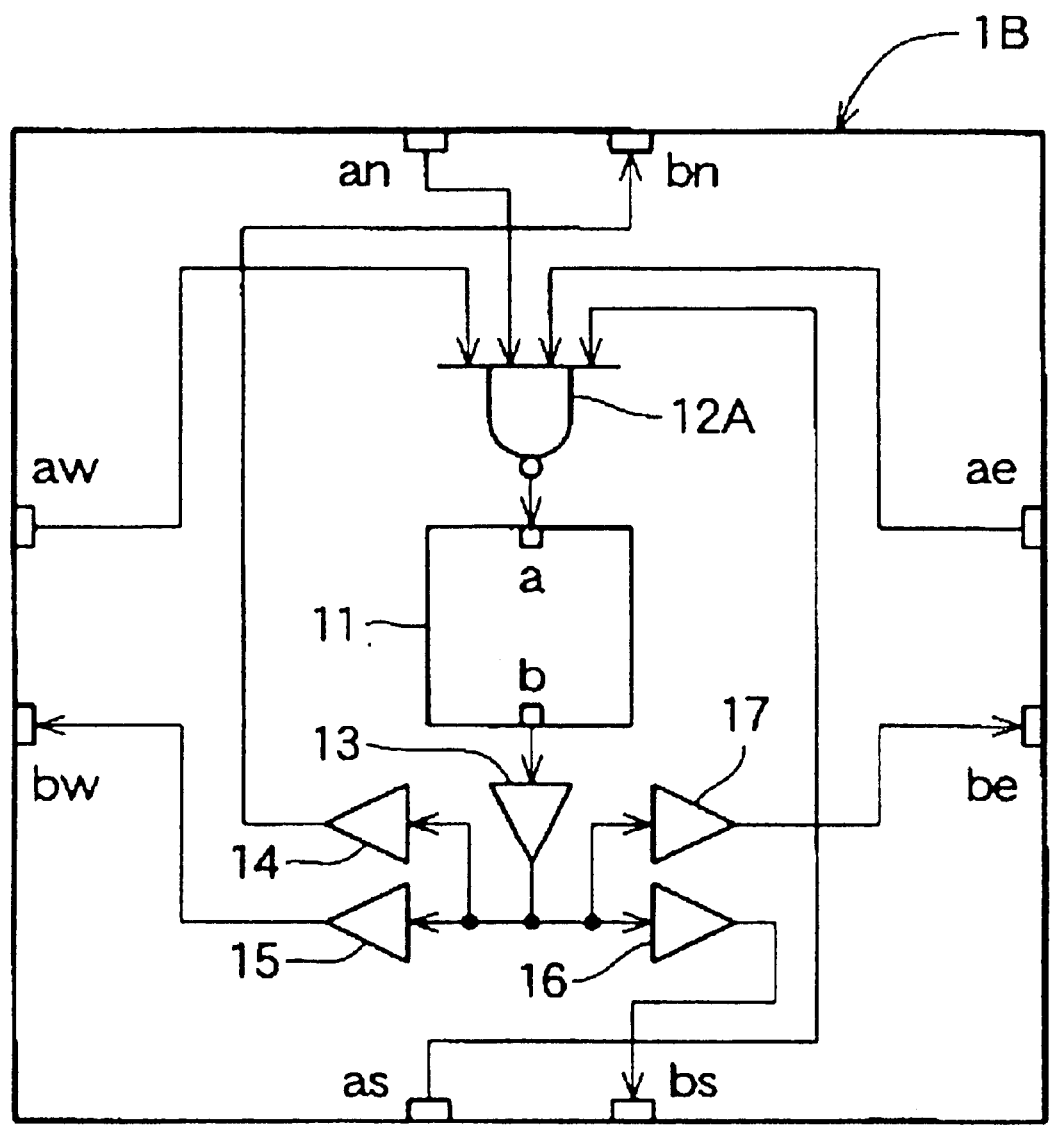
FIG. 4 shows a configuration of a semiconductor device (macro cell) according to a third embodiment of the present invention.

FIG. 4 shows a configuration of a semiconductor device (macro cell) according to a third embodiment of the present invention. In the macro cell 1B shown in FIG. 4, a NAND circuit 12A is used to constitute the input terminal selector. When the NAND circuit 12A is used, input terminals not used are fixed to logical 1. Thus, the signal supplied to the input terminal to be used can reverse its logical level when supplied to the input terminal "a" of the internal kernel circuit 11.

The NAND circuit 12A may be replaced by an AND circuit. When the AND circuit is used, the logical level of the input terminal can be transferred to the internal kernel circuit 11 without reversing the logical level. However, the signal delay in the AND circuit is greater than in the NAND circuit 12A.

Figure 5:
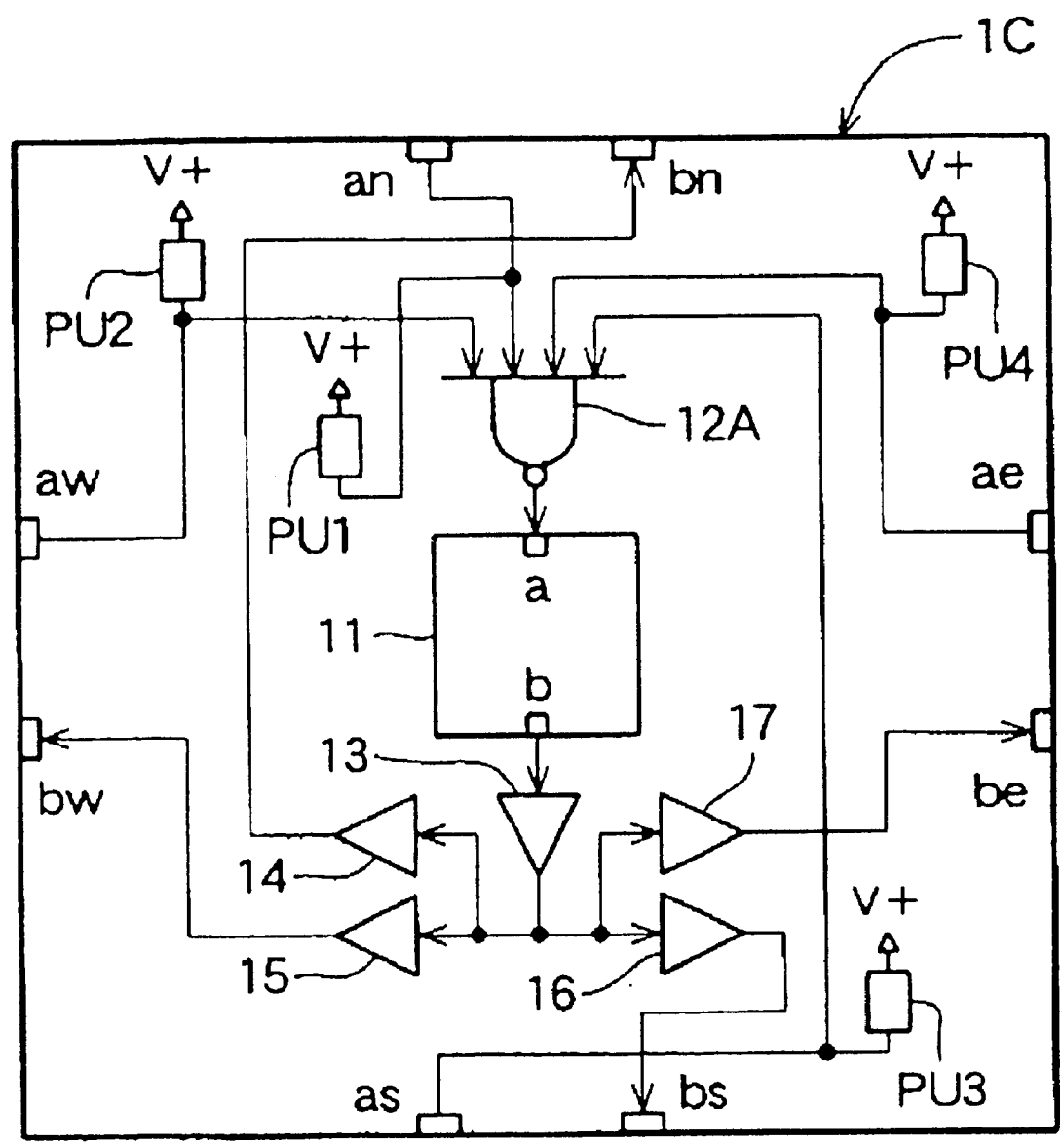
FIG. 5 shows a configuration of a semiconductor device (macro cell) according to a fourth embodiment of the present invention.

FIG. 5 shows a configuration of a semiconductor device (macro cell) according to the fourth embodiment of the present invention. In the macro cell 1C shown in FIG. 5, the NAND circuit 12A constituting the input terminal selector has input terminals pulled up via pull-up elements PU1, PU2, PU3, and PU4, respectively. The pull-up elements PU1, PU2, PU3, and PU4 are made by using MOS transistors for active load and resistors. By arranging the pull-up elements PU1, PU2, PU3, and PU4 in the macro cell 1C and pulling up the input terminals "an", "aw", "as", and "ae", the input terminals not to be used may not be fixed to logical 1. Accordingly, only the terminal to be used requires a macro-connecting wire and a connection wire to an external terminal.

Figure 6:
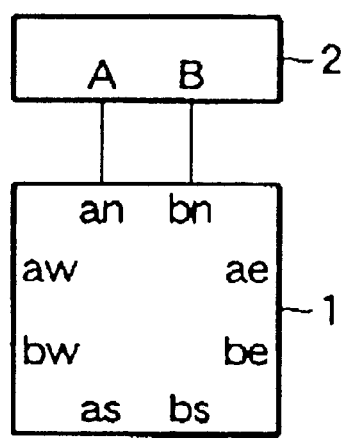
FIG. 6 shows connection examples between a macro cell having identical terminals at its four sides and another macro cell.
Figure 6:
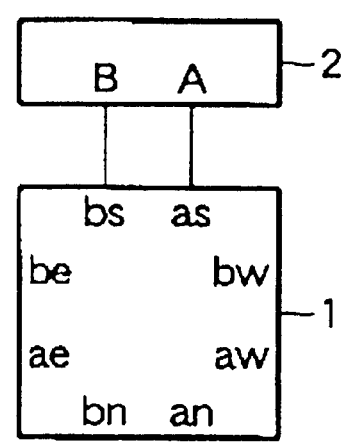
Figure 6:
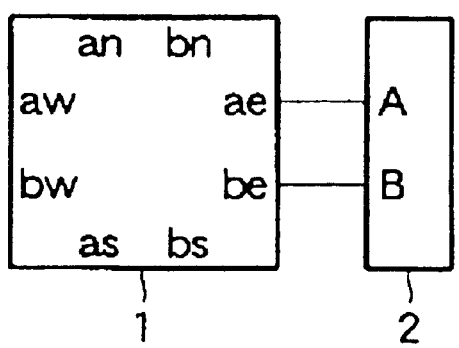
Figure 6:
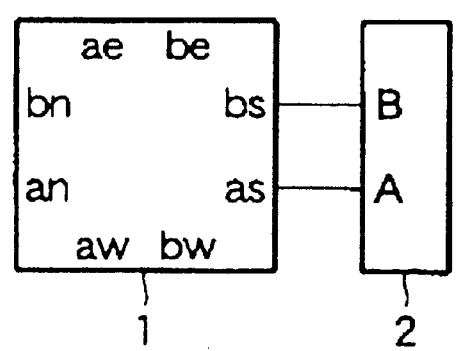

FIG. 6 shows connection examples between a macro cell having identical terminals at its four sides and another macro cell. In the macro cells 1, 1A, 1B, and 1C shown in FIG. 1 and FIG. 3 to FIG. 5, the terminal arrangement at the upper side is identical to the terminal arrangement at the lower side and the terminal arrangement at the left side is identical to the terminal arrangement at the right side. For this, by modifying the arrangement direction of the macro cells 1, 1A, 1B, and 1C, it is possible to perform macro-connecting wiring with a high efficiency.

As shown in FIG. 6(a), when the other macro cell 2 is located above the macro cell 1, if the terminal arrangement in the macro cell 2 is identical to that of the upper side of the macro cell 1, the terminal A is connected to the terminal "an" and the terminal B is connected to the terminal "bn". Thus, there is no intersection between the macro-connecting wires, eliminating need to use a multi-layered wiring. As shown in FIG. 6(b), when the macro cell 2 has a terminal arrangement which is reversed as compared to the terminal arrangement of the upper side of the macro cell 1, the macro cell 1 may be rotated by 180 degrees from the direction shown in FIG. 6(b), thereby enabling to connect the terminal B to the terminal "bs" and the terminal A to the terminal "as" without intersecting the wires. The terminals can also be connected without intersections by rotating the macro cell 1 by 90 degrees clockwise from the direction shown in FIG. 6(a).

As shown in FIG. 6(c), when the other macro cell 2 is arranged at the right of the macro cell 1, if the macro cell 2 has a terminal arrangement identical to the terminal arrangement at the right side of the macro cell 1, the terminal A is connected to the terminal "ae" and the terminal B is connected to the terminal "be". This eliminates need to use a multi-layered wiring because there is no intersections between the wires. As shown in FIG. 6(d), when the macro cell 2 has a terminal arrangement reversed as compared to the terminal arrangement at the right side of the macro cell 1, the macro cell 1 may be rotated by 90 degrees counter-clockwise from the direction shown in FIG. 6(c), thereby enabling to connect the terminal B to the terminal "bs" and the terminal A to the terminal "as" without intersecting the wires. It should be noted that in the case shown in FIG. 6(d), the macro cell 1 may also be rotated by 180 degrees from the direction shown in FIG. 6(c).

Similarly, when the other macro cell 2 is located at the left or below the macro cell 1, by changing the direction of the arrangement of the macro cell 1, it is possible to reduce the wire length without intersecting the macro-connecting wires. It should be noted that it is possible to eliminate intersections between the macro-connecting wires by changing the direction of the arrangement of the macro cell 1 if terminals are provided at least two sides of the macro cell 1.

Figure 7:
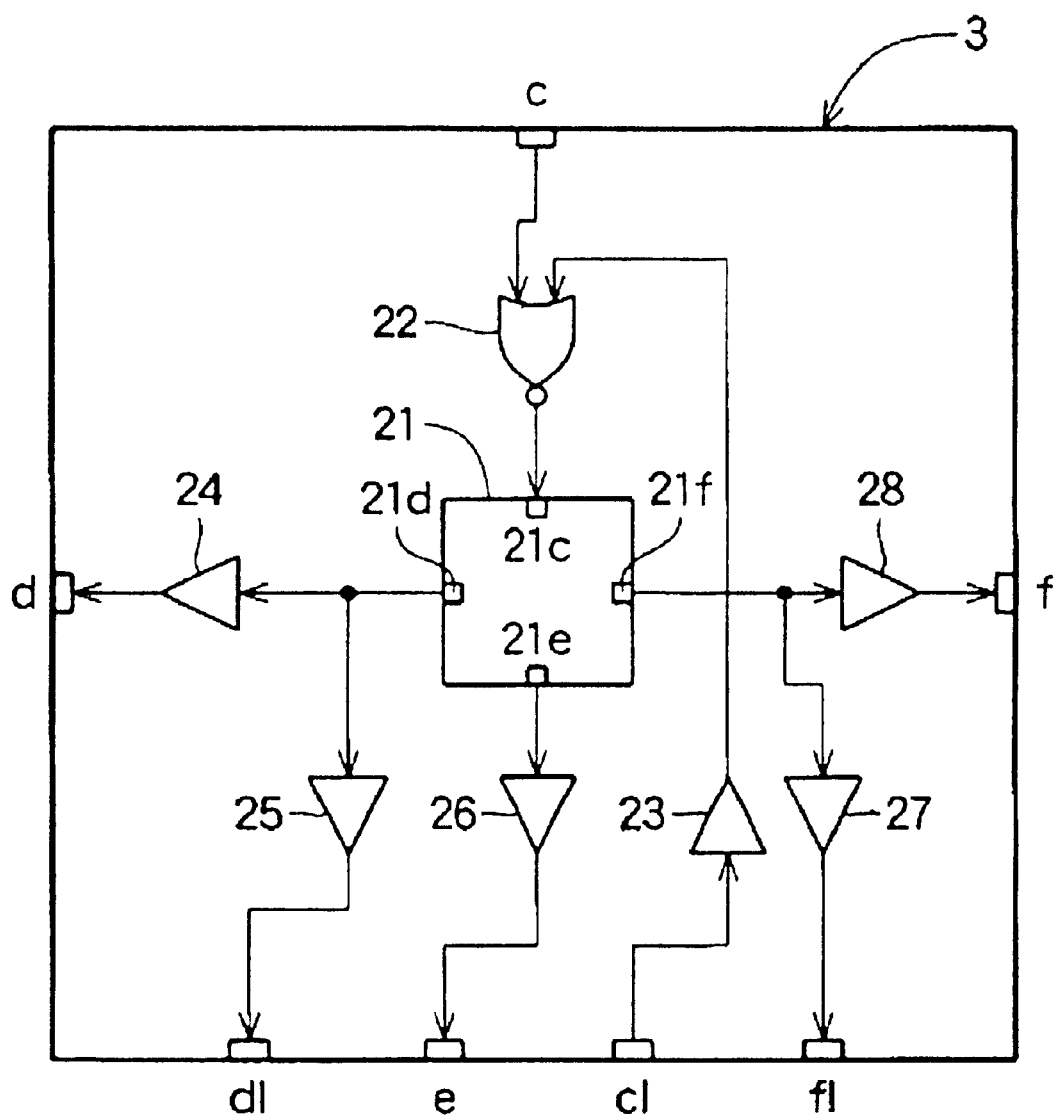
FIG. 7 shows a configuration of a semiconductor device (macro cell) according to a fifth embodiment of the present invention.

FIG. 7 shows a configuration of a semiconductor device (macro cell) according to a fifth embodiment of the present invention. The macro cell 3 shown in FIG. 7 may be utilized for a single chip and a logic macro cell. This macro cell 3 includes an internal kernel circuit (functional block) 21, two-input NOR circuit 22 constituting the input terminal selector, an input buffer circuit 23, five output buffer circuits 24, 25, 26, 27, and 28, two input terminals "c", and five output terminals "d", "dI", "e", "f", and "fI". The internal kernel circuit (functional block) 21 includes an input terminal 21c and three output terminals 21d, 21e, and 21f.

The input terminal "c" is for a single chip and is arranged at the upper side of the macro cell 3. This input terminal "c" is connected to one of the input terminals of the NOR circuit 22. The input terminal cI is for a logic macro cell and is located at the lower side. This input terminal cI is connected to the other input terminal of the NOR circuit 22. The NOR circuit 22 has an output terminal connected to the input terminal 21c of the internal kernel circuit (functional block) 21. According, the terminal c and terminal cI serve as input terminals having an identical function.

The terminal "d" arranged at the left side of the macro cell 3 is a first output terminal for a single chip while the terminal "dI" located at the lower side of the macro cell 3 is a first output terminal for a logic macro cell. The internal kernel circuit (functional block) 21 has the first output terminal 21d connected to the input terminal of the buffer circuit 24 and to the input terminal of the buffer circuit 25. The buffer circuit 24 has an output terminal connected to the first output terminal d for a single chip. The buffer circuit 25 has an output terminal connected to the first output terminal dI for a logic macro cell. Accordingly, the terminal d and the terminal dI serve as output terminals having an identical function.

The terminal "e" arranged at the lower side of the macro cell 3 is a second output terminal and can be used for a single chip and for a logic macro cell. The internal kernel circuit (functional block) 21 has the second output terminal 21e connected to the input terminal of the buffer circuit 25. The buffer circuit 25 has an output terminal connected to the second output terminal xe".

The terminal "f" arranged at the right side of the macro cell 3 is a third output terminal for a single chip and the terminal "fi" arranged at the lower side of the macro cell 3 is a third output terminal for a logic macro cell. The output terminal 21f of the internal kernel circuit (functional block) 21 is connected to an input terminal of the buffer circuit 27 and to the input terminal of the buffer circuit 28. The buffer circuit 28 has an output terminal connected to the third output terminal f for a single chip. The buffer circuit 27 has an output terminal connected to the third output terminal fI for a logic macro cell. Accordingly, the terminal f and the terminal fI serves as output terminals having an identical function.

Thus, when two terminals have an identical function, a symbol "I" is added to the end of the terminal names for a logic macro cell arranged at the lower side of the macro cell 3 so as to facilitate identification of the terminals.

Figure 8:
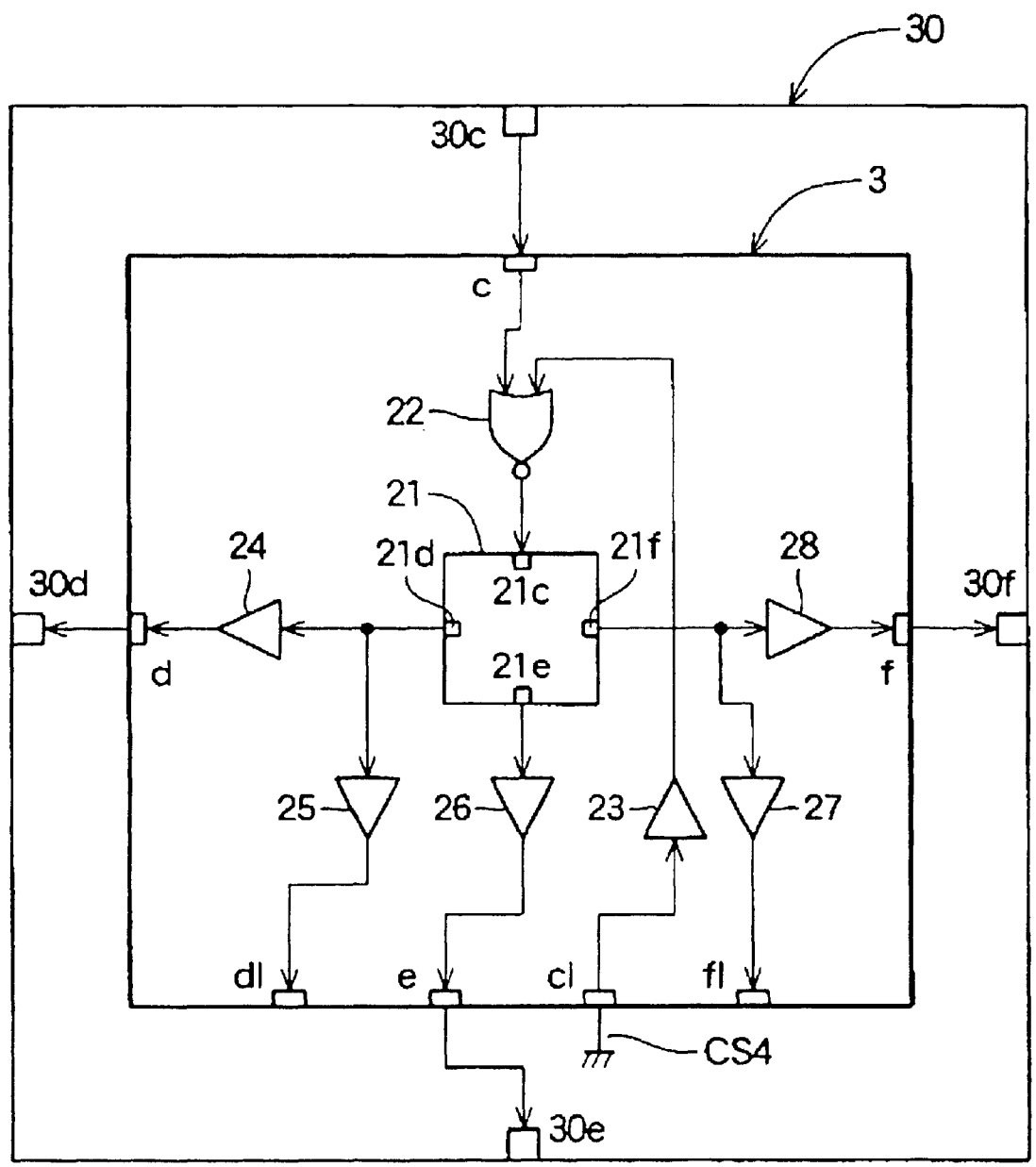
FIG. 8 shows a configuration for realizing a single chip using the macro cell shown in FIG. 7.

FIG. 8 shows a configuration for realizing a single chip by using the macro cell shown in FIG. 7. A pad (external terminal) 30c for input terminal arranged at the upper side of the chip 30 is connected to an input terminal "c" of the macro cell 3; a pad 30d for the first output terminal arranged at the left side of the chip 30 is connected to the first output terminal d; a pad 30e for the second output terminal arranged at the lower side of the chip 30 is connected to the second output terminal e of the macro cell 3; and a pad 30f for the third output terminal arranged at the right side of the chip 30 is connected to the third output terminal f of the macro cell 3. Furthermore, the reserved input terminal cI for a logic macro cell is connected to the clamp cell CS4 and the input terminal cI for a logic macro cell is fixed to logical 0. The output terminals dI and fI not used are left open (not connected). This enables to realize a single chip.

Figure 18:
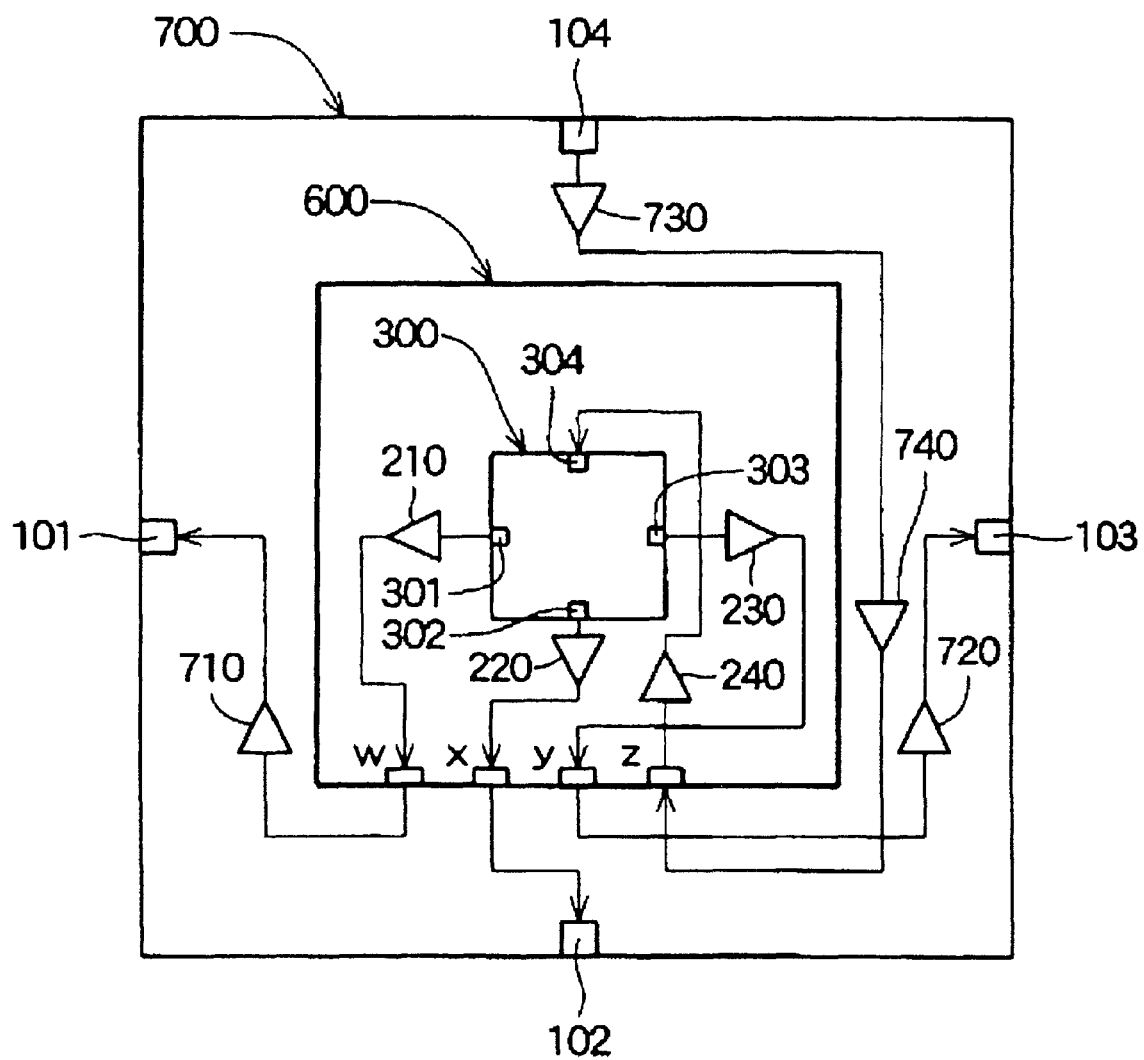
FIG. 18 shows a configuration of a macro cell designed for a logic core and utilized to realize a single chip.

As shown in FIG. 18, when constituting a single chip by using a logic macro-dedicated macro cell having terminals arranged only on one of its sides, long wires are required for connections between the terminals and the pads. On the contrary, when terminals having an identical function are provided at different sides of the macro cell, it is possible to reduce the leading wire length to the respective pads. In the macro cell 3 shown in FIG. 7, the terminals c, d, and f for a single chip are arranged at a side different from the side having the logic macro cell terminals. Accordingly, as shown in FIG. 8, by using the terminals, c, d, and f for a single chip, it is possible to reduce the leading wire length to the pads. Thus, it is possible to reduce the signal delay due to the leading wire, thereby enabling to obtain a high-speed operation.

Figure 9:
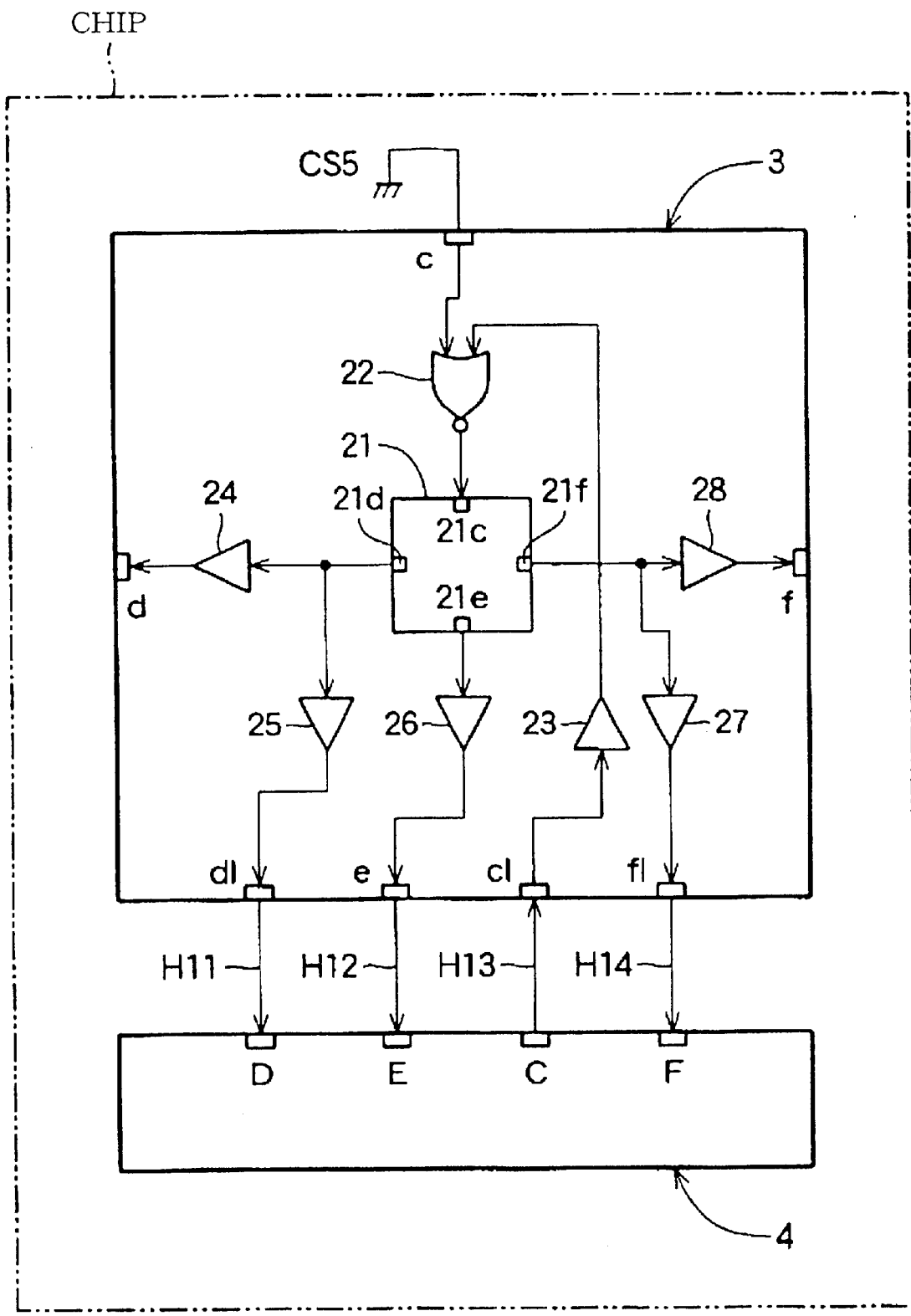
FIG. 9 shows a configuration for realizing a chip using the macro cell shown in FIG. 7 in combination with another macro cell.

FIG. 9 shows a configuration of a chip using the macro cell shown in FIG. 7 in combination with another macro cell. FIG. 9 shows an example in which the other macro cell 4 is arranged below the macro cell 3. The reference symbol D denotes a first input terminal of the macro cell 4, E denotes a second input terminal of the macro cell 4, C denotes an output terminal of the macro cell 4, and F denotes a third input terminal of the macro cell 4. In such a macro arrangement, by using the terminals dI, e, cI and fI for the logic macro cell arranged at the lower side of the macro cell 3, it is possible to minimize the macro-connecting wire and minimize the wire delay.

Accordingly, the output terminal dI of the macro cell 3 is connected to the input terminal D of the macro cell 4 by the macro-connecting wire H11, the output terminal e of the macro cell 3 is connected to the input terminal E of the macro cell 4 by the macro-connecting wire H12, the output terminal cI of the macro cell 3 is connected to the output terminal C of the macro cell 4 by the macro-connecting wire H13, and the output terminal fI of the macro cell 3 is connected to the input terminal F of the macro cell 4 by the macro-connecting wire H14. The input terminal c not used at the upper side is connected to the clamp cell CS5 so as to fix the input terminal c to logical 0.

In the macro cell 3 shown in FIG. 7, terminals for a logic macro cell are arranged at the lower side of the macro cell 3 so that it can be utilized for both of a single chip and a logic macro cell. Accordingly, as shown in FIG. 9, when using the macro cell 2 in combination with another macro cell 4, by using the terminals for the logic macro cell, it is possible to reduce the macro-connecting wire length and reduce the signal delay due to the macro-connecting wire.

Figure 10:
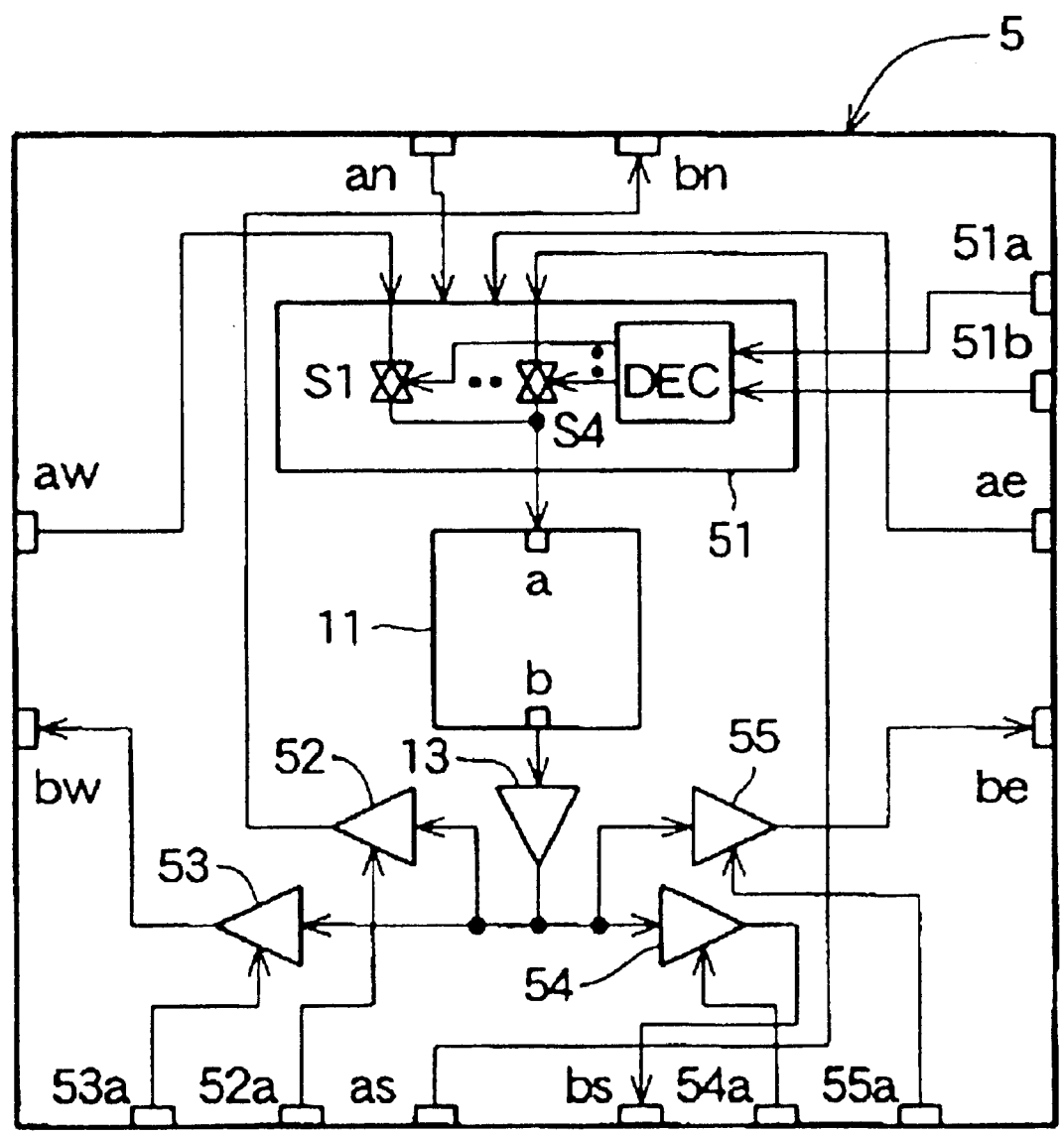
FIG. 10 shows a configuration of a semiconductor device (macro cell) according to a sixth embodiment of the present invention.

FIG. 10 shows a configuration of a semiconductor device (macro cell).according to a sixth embodiment of the present invention. In the macro cell 5 shown in FIG. 10, a multiplexer circuit 51 is used to constitute the input terminal selector and tri-state buffer circuits 52 to 55 constitute the output terminal selector. The other portions are identical to the one shown in FIG. 1.

The multiplexer circuit 51 has four sets of switch circuits S1 to S4 each composed of a MOS transistor such as a transfer gate for example, and a decode circuit DEC. One end of the switch circuits S1 to S4 is connected to the input terminals "an", "aw", "as", and "ae", respectively while the other end of the switch circuits S1 to S4 is connected to the input terminal "a" of the internal kernel circuit 11. Reference symbols 51a and 51b are input terminals for input terminal specifying data of 2-bit configuration. The decode circuit DEC controls the switch circuits S1 to S4 specified by the input terminal specifying data of 2-bit configuration, to a conductive state. Thus, it is possible to select the input terminals "an", "aw", "as", and "ae" used according to the input terminal specifying data.

When using an AND circuit and an OR circuit to constitute the input selector, input terminals "an", "aw", "as", and "ae" should be fixed to a predetermined logical level. As compared to this, when using the multiplexer circuit 51 of the switch circuit configuration, it is possible to leave open the input terminals "an", "aw", "as", and "ae" not used. Moreover, when using the multiplexer circuit 51, a plurality of input terminals "an", "aw", "as", and "ae" may be connected by wires.

When the input terminal to be used by a layout designer is determine, the input terminals 51a and 51b of the input terminal specifying data are fixed to a predetermined logical level via a clamp cell or the like.

When it is necessary to modify the input signal wire route or to supply a different input signal to the internal kernel circuit 11, the input terminals 51a and 51b of the input terminal specifying data are connected to an external terminal or another cell. By supplying an input terminal specifying data from an eternal terminal or another cell, it is possible to change the input terminals used "an", "aw", "as", and "ae". This enables to select a wire route preferable for the input signal delay time and to modify the function of the macro cell 5 by supplying a different input signal to the internal kernel circuit 11.

It should be noted that when the multiplexer circuit 51 is used to constitute the input selector, the logical level of the input terminal is supplied to the input terminal "a" of the internal kernel circuit 11 without reversing its logical level. If this causes a mismatch in the logic of the input signal, an inverter or the like is arranged between the output of the multiplexer circuit 51 and the input terminal "a" of the internal kernel circuit 11. Moreover, assuming that an unused input terminal is erroneously selected to fluctuate the input signal, the output of the multiplexer circuit 51 may be pulled up or pulled down.

By using the tri-state buffer circuits 52 to 55 to drive the output terminals "bn", "bw", "bs", and "be", it is possible to stop drive of the unused output terminals "bn", "bw", "bs", and "be". This can reduce the power consumption. Reference symbols 52a to 55a denote output control input terminals for controlling output of the tri-state buffers 52 to 55. Since the output control input terminals 52a to 55a are arranged for the respective tri-state buffers 52 to 55, it is possible to set whether to use each of the output terminals "bn", "bw", "bs", and "be" as an output terminal. It is also possible to set so as to use a plurality of output terminals.

When an output terminal to be used is already determined by the layout design, the output control input terminals 52a to 55a are fixed to a predetermined logical level via a clamp cell or the like. It should be noted that it is also possible to pull down the output control input terminals 52a to 55a and fix only the output control input terminals 52a to 55a corresponding to the output terminal to be used, to logical 1 for example.

When it is necessary to modify the output signal wire route or modify the output signal supply destination, the output control input terminals 52a to 55a are connected to an external terminal or another cell and to set the logical level of the output control input terminals 52a to 55a from the eternal terminal or the other cell.

Figure 11:
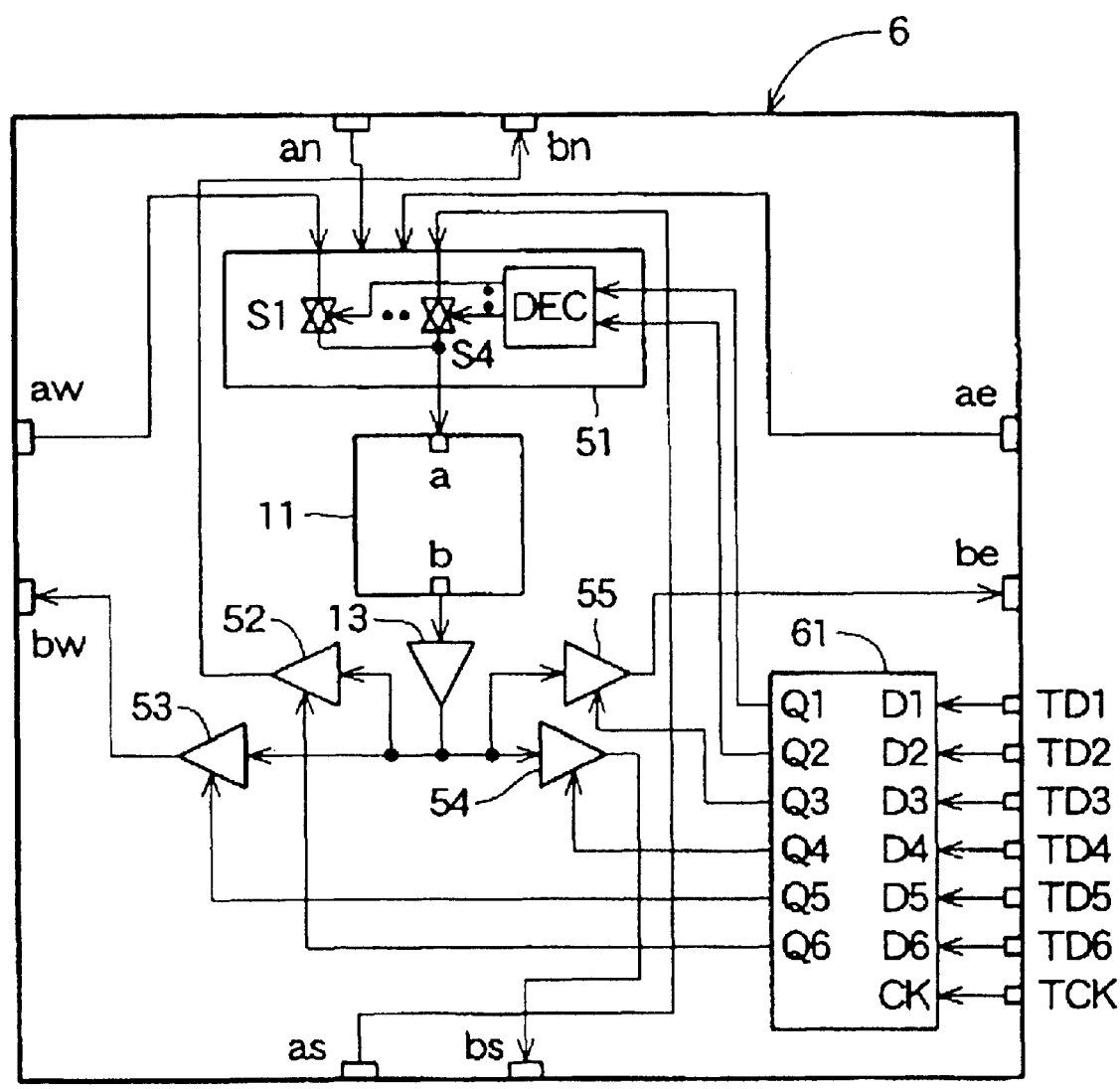
FIG. 11 shows a configuration of a semiconductor device (macro cell) according to a seventh embodiment of the present invention.

FIG. 11 shows a configuration of a semiconductor device (macro cell) according to a seventh embodiment of the present invention. The macro cell 6 shown in FIG. 11 is identical to the macro cell 5 shown in FIG. 10 and added by a data latch circuit 61. The data latch circuit 61 has an output terminal Q1 and an output terminal Q2 connected to the decode circuit DEC in the multiplexer circuit 51. The decode latch circuit 61 has output terminals Q3 to Q6 respectively connected to the output control terminals of the tri-state buffer circuits 55, 54, 53, and 52. Reference symbols TD1 to TD6 are input terminals of the terminal selection data (parallel data) and are connected to the data input terminals D1 to D6 of the data latch circuit 61, respectively. A reference symbol TCK is an input terminal of the latch lock for latching the terminal selection data (parallel data) and is connected to the latch lock input terminal CK of the data latch circuit 61.

The data latch circuit 617 latches the terminal selection data (parallel data according to the latch lock and outputs the latched terminal selection data (parallel data) to the data output terminals Q1 to Q6. Accordingly, by the 2-bit data supplied to the terminals TD1 and TD2, it is possible to set input terminals "an", "aw", "as", and "ae" to be used. By the data (logical level) supplied to the terminal TD3, it is possible to control the operation of the tri-state buffer circuit 55 and to set whether to drive the output terminal "be". Similarly, by the data (logical level) supplied to the terminals TD4 to TD6, it is possible to control operation (output drive/(non-drive) of each of the tri-state buffer circuits 54, 53, and 52.

It should be noted that when the macro cell includes a data bus, it is also possible to supply the terminal selection data (parallel data) via the data bus, latch the terminal selection data (parallel data) in the data latch circuit arranged in the macro cell, and select an input terminal and an output terminal according to the latched terminal selection data (parallel data).

Figure 12:
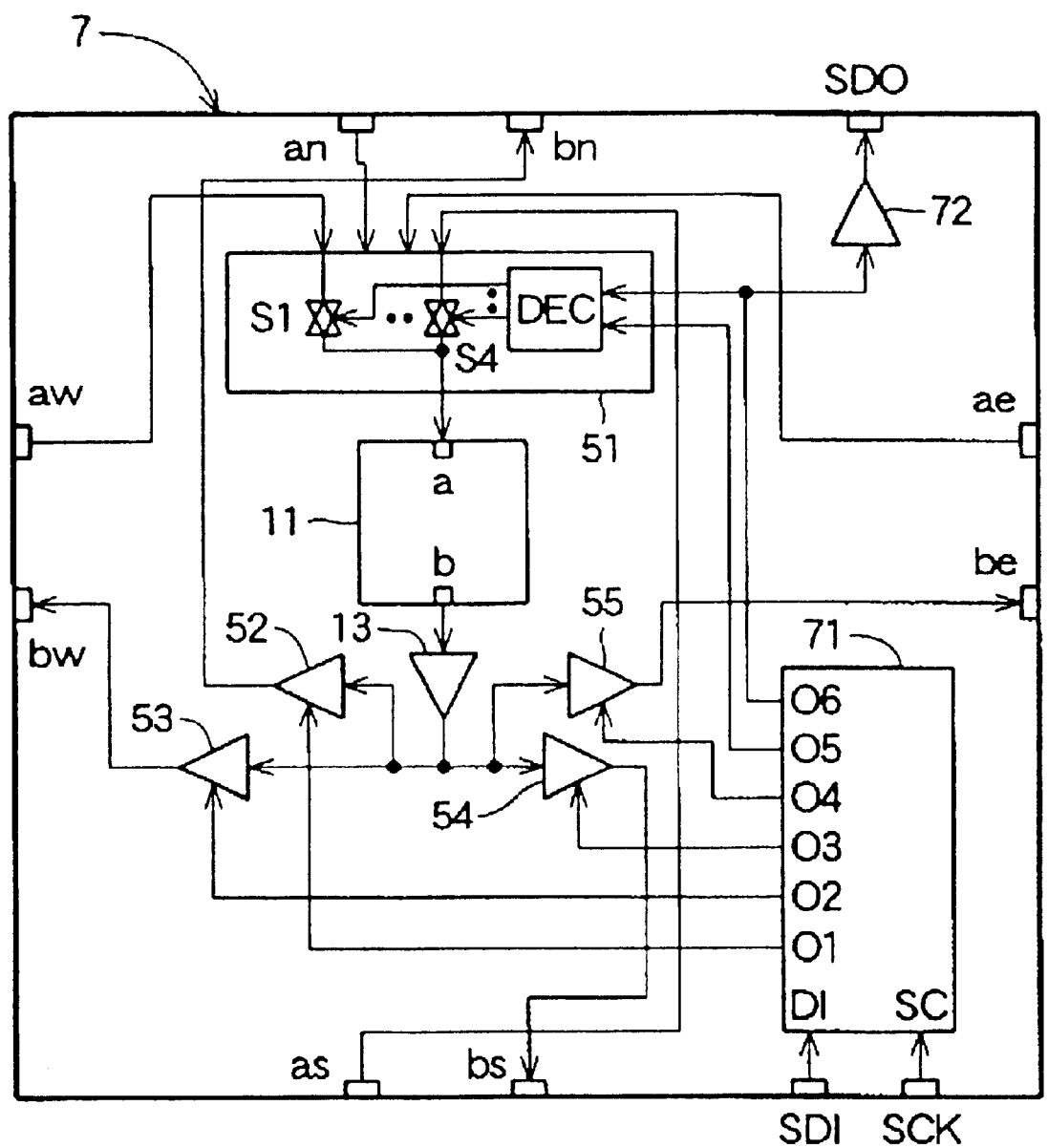
FIG. 12 shows a configuration of a semiconductor device (macro cell) according to an eighth embodiment of the present invention.

FIG. 12 shows a configuration of a semiconductor device (macro cell) according to an eighth embodiment of the present invention. The macro cell 7 shown in FIG. 12 is identical to the macro cell 5 shown in FIG. 10 added by a shift register circuit 71 and a buffer circuit 72.

The shift register circuit 71 should output data of each shift stage in serial data input. A reference symbol D1 denotes a serial data input terminal of the shift register 71, O1 to O6 denotes output terminals of the respective shift stages, and SC denotes a shift clock input terminal. The output terminals O6 and O5 are connected to the decode circuit DEC in the multiplexer circuit 51. The output terminals O4 to O1 are connected to output control terminals of the tri-state buffer circuits 55, 54, 53, and 52, respectively. The output terminal O6 of the final stage is connected via the buffer circuit 72 to the serial data output terminal SDO. A reference symbol SDI denotes an input terminal of a terminal selection data (serial data) and is connected to the serial data input terminal DI. A reference symbol SDI denotes an input terminal of the terminal selection data (serial data) and is connected to the serial data input terminal D1. The reference symbol SCK is a terminal selection data shift clock input terminal and is connected tot he shift clock input terminal.

This macro cell 7 supplies the terminal selection data (serial data) in synchronization with the terminal selection data shift clock, so as to set input terminals to be used "an", "aw", "as", and "ae" and output terminals to be used "bn", "bw", "bs", and "be".

For example, it is assumed that "111000" is supplied as the terminal selection data (serial data) in synchronization with the shift clock and the outputs of the output terminals O6 to O1 of the shift register 71 are set to "111000". In this case, according to the output of logical 1 from the output terminal O4 of the shift register 71, the tri-state buffer circuit 55 enters an operation state. Since the outputs of the output terminals O3, O2, and O1 are logical 0, the other tri-state buffer circuits 54, 53, and 52 are controlled into a non-operation state. Accordingly, it is possible to use only the output terminal "be" arranged at the right side of the macro cell 7. The multiplexer circuit 51 controls one of the switch circuits S1 to S4 to a conductive state according to the 2-bit data supplied from the output terminals O6 and O5 of the shift register 71. Here, if it is assumed that the decoder circuit DEC controls the switch circuit S4 to a conductive state when the data of "11" is supplied, the input terminal "ae"arranged at the right side of the macro cell 7 is set as an input terminal that can be used.

The serial data output terminal SDO is supplied with an output of the final stage of the shift register 71. Accordingly, by connecting the output terminal SDO to an input terminal SDI of another macro cell terminal selection data (serial data), it is possible to select at terminal for a plurality of macro cell. Moreover, by monitoring the terminal selection data (serial data) utilizing the serial data output terminal SDO, it is possible to confirm a shift state of the terminal selection data (serial data) and a terminal selection state in the macro cell.

Figure 13:
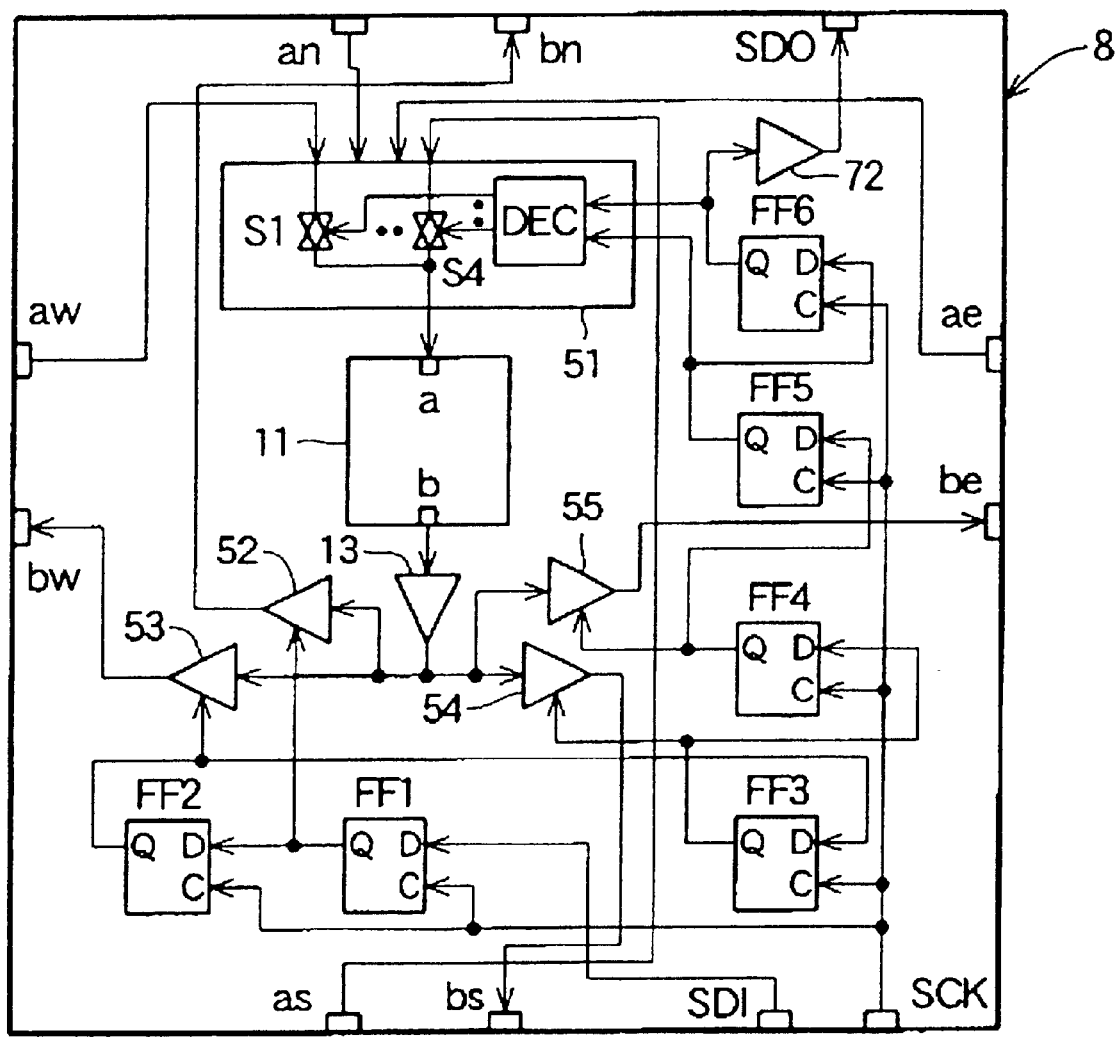
FIG. 13 shows a configuration of a semiconductor device (macro cell) according to a ninth embodiment of the present invention.

FIG. 13 shows a configuration of a semiconductor device (macro cell) according to a ninth embodiment of the present invention. In the macro cell 8 shown in FIG. 13, six D-type flip-flop circuits FF1 to FF6 are arranged in the macro cell and the D-type flip-flop circuits FF1 to FF6 are longitudinally connected, thereby constituting a scan latch chain circuit (shift register). This macro cell 8 performs a terminal selection operation identical to that of the macro cell 7 shown in FIG. 12.

A shift clock (scan clock) supplied to the input terminal SCK of the shift clock (scan clock) is supplied to a clock input terminal C of the D-type flip-flop circuits FF1 to FF6. The terminal selection data supplied to the terminal selection data input terminal SDI is supplied to a data input terminal D of the first-stage D-type flip-flop circuit FF1. An output from the data output terminal Q of the first-stage D-type flip-flop circuit FF1 is supplied to the data input terminal D of the second-stage D-type flip-flop circuit FF2 and to the control input terminal of the tri-state buffer circuit 52. An output from the data output terminal Q of the second-stage D-type flip-flop circuit FF2 is supplied to the data input terminal D of the third-stage D-type flip-flop circuit FF3 and to the control input terminal of the tri-state buffer circuit 53. An output from the data output terminal Q of the third-stage D-type flip-flop circuit FF3 is supplied to the data input terminal D of the fourth-stage D-type flip-flop circuit FF4 and to the control input terminal of the tri-state buffer circuit 54. An output from the data output terminal Q of the fourth-stage D-type flip-flop circuit FF4 is supplied to the data input terminal D of the fifth-stage D-type flip-flop circuit FF5 and to the control input terminal of the tri-state buffer circuit 55. An output from the data output terminal Q of the fifth-stage D-type flip-flop circuit FF5 is supplied to the data input terminal D of the sixth-stage D-type flip-flop circuit FF6 and to one of the input terminals of the decode circuit DEC of the multiplexer circuit 51. An output from the data output terminal Q of the sixth-stage D-type flip-flop circuit FF6 is supplied to the other of the input terminals of the decode circuit DEC of the multiplexer circuit 51 and to the terminal selection data output terminal SDC via the buffer circuit 72.

Figure 14:
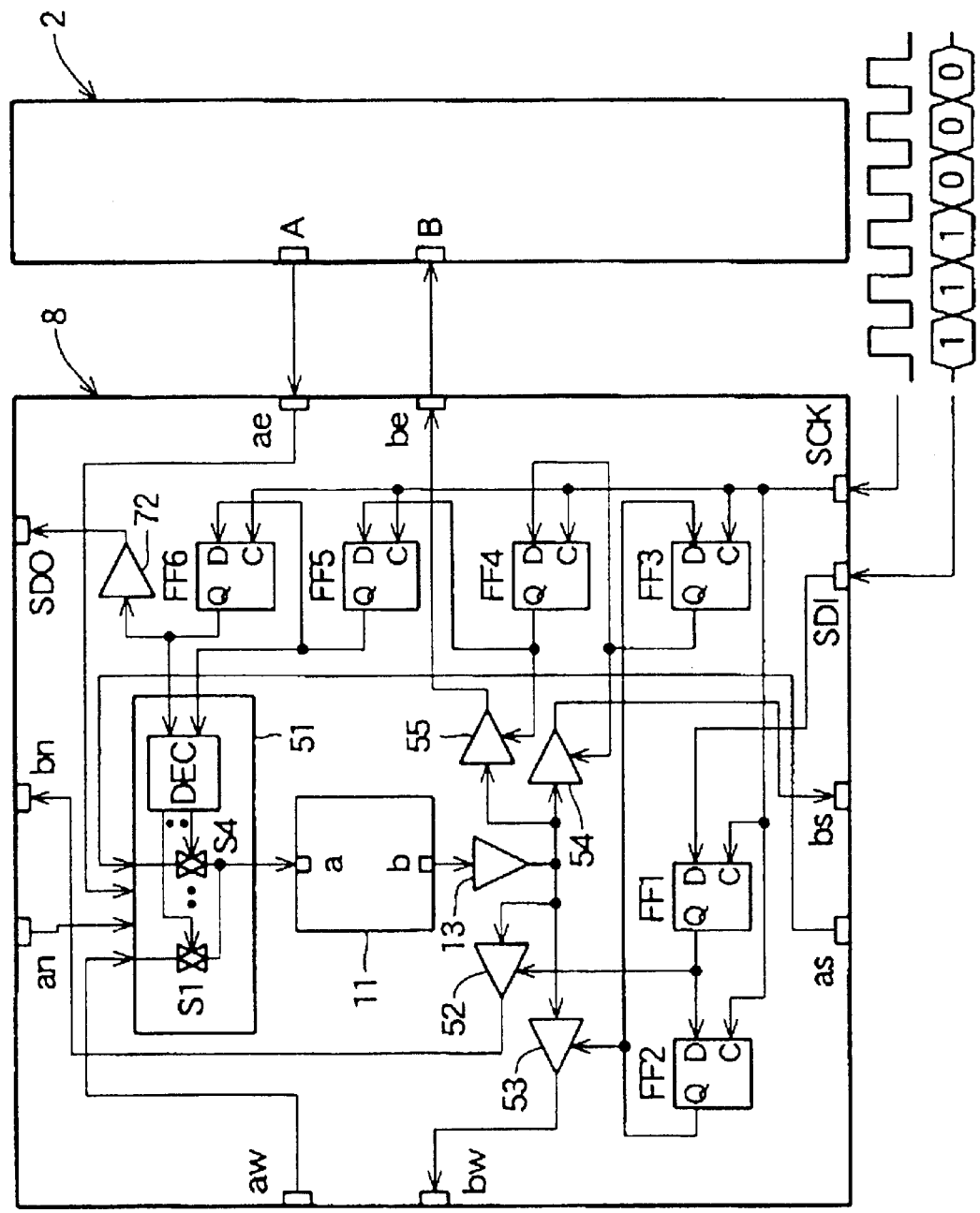
FIG. 14 shows a configuration using the macro cell shown in FIG. 13 in combination with another macro cell.
Figure 15:
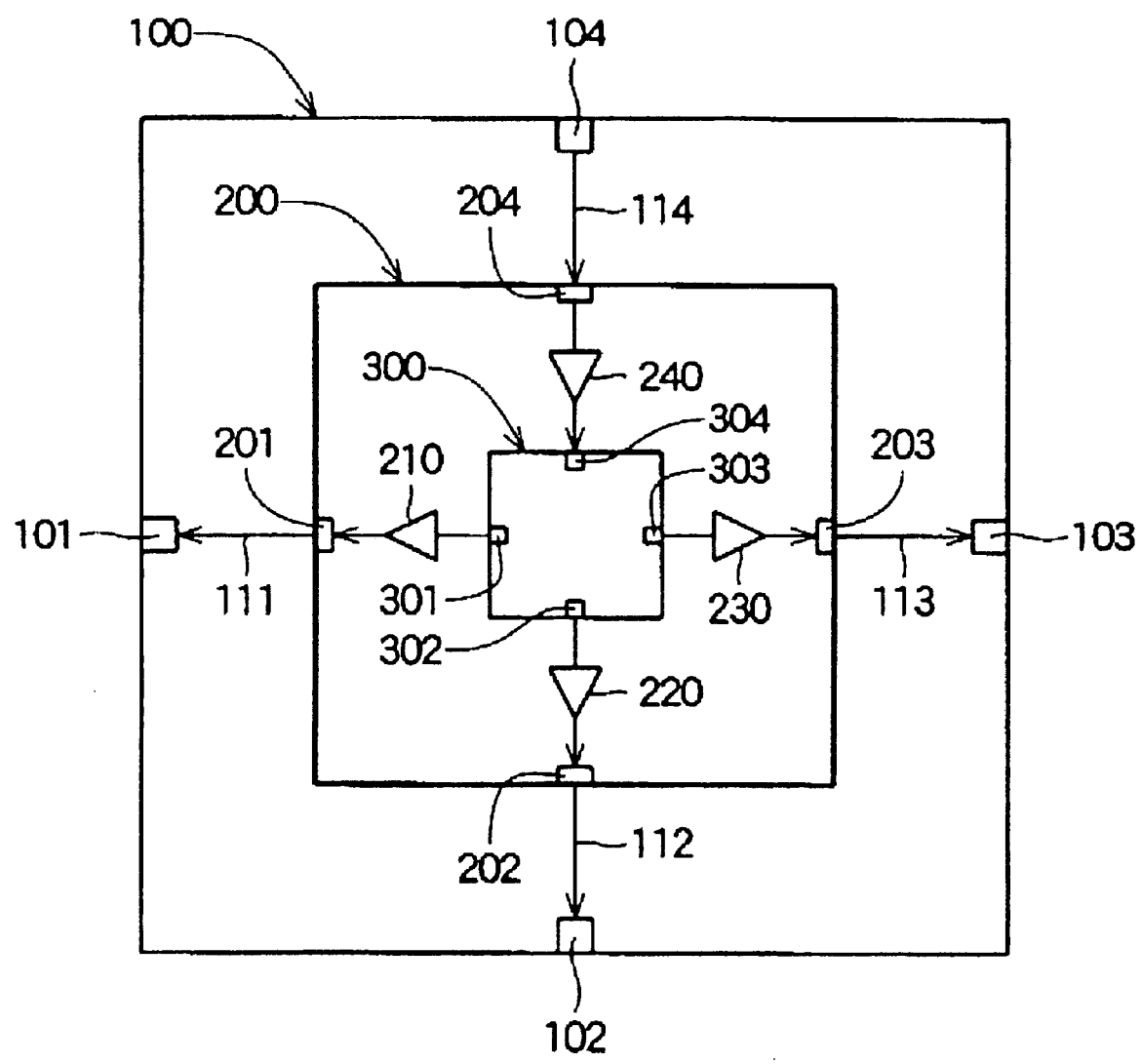
FIG. 15 shows a configuration of a macro cell designed for a single chip and used as a single chip.
Figure 16:
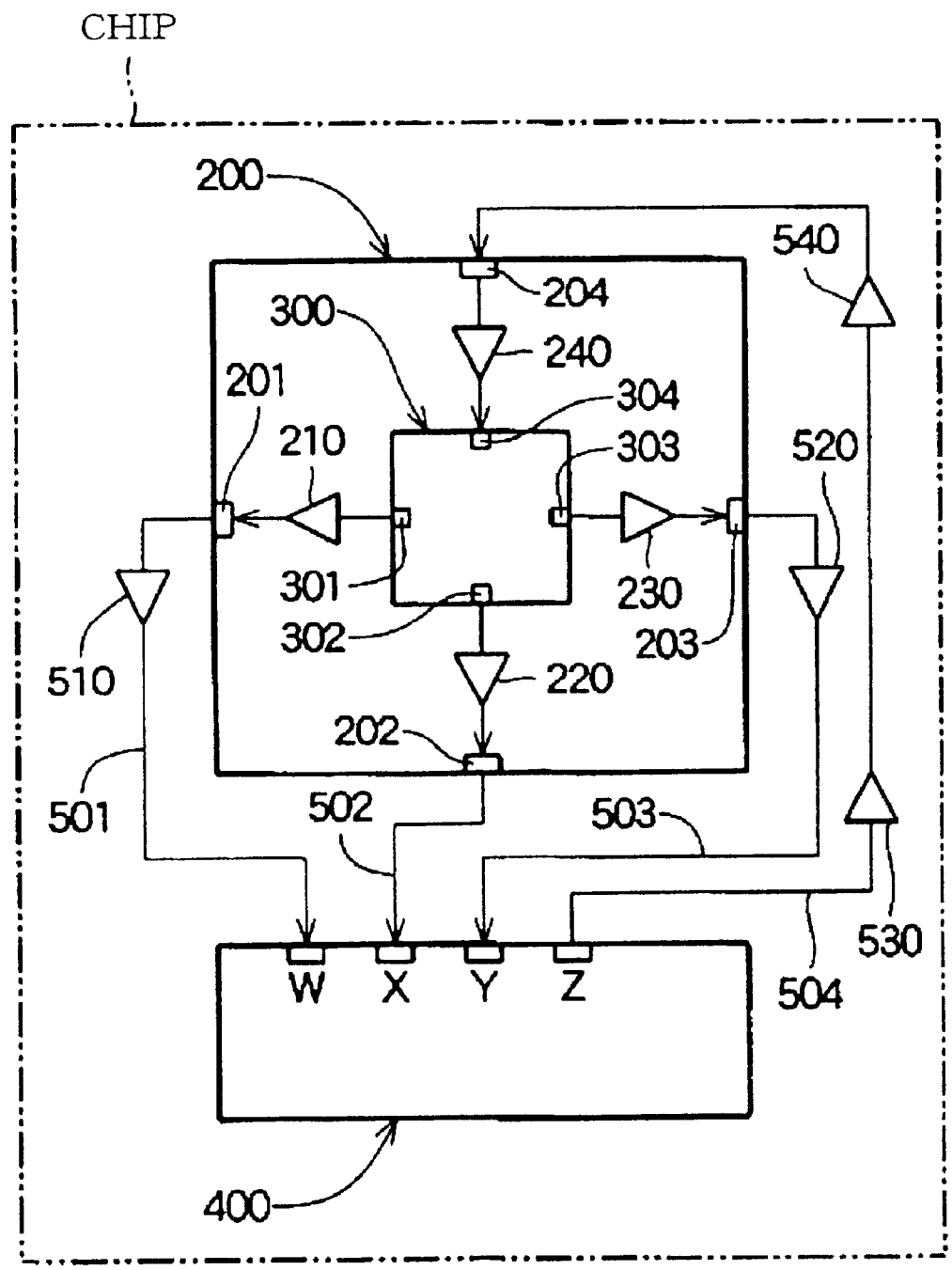
FIG. 16 shows a configuration of a macro cell designed for a single chip and used in combination with a macro cell designed for a logic core.
Figure 17:
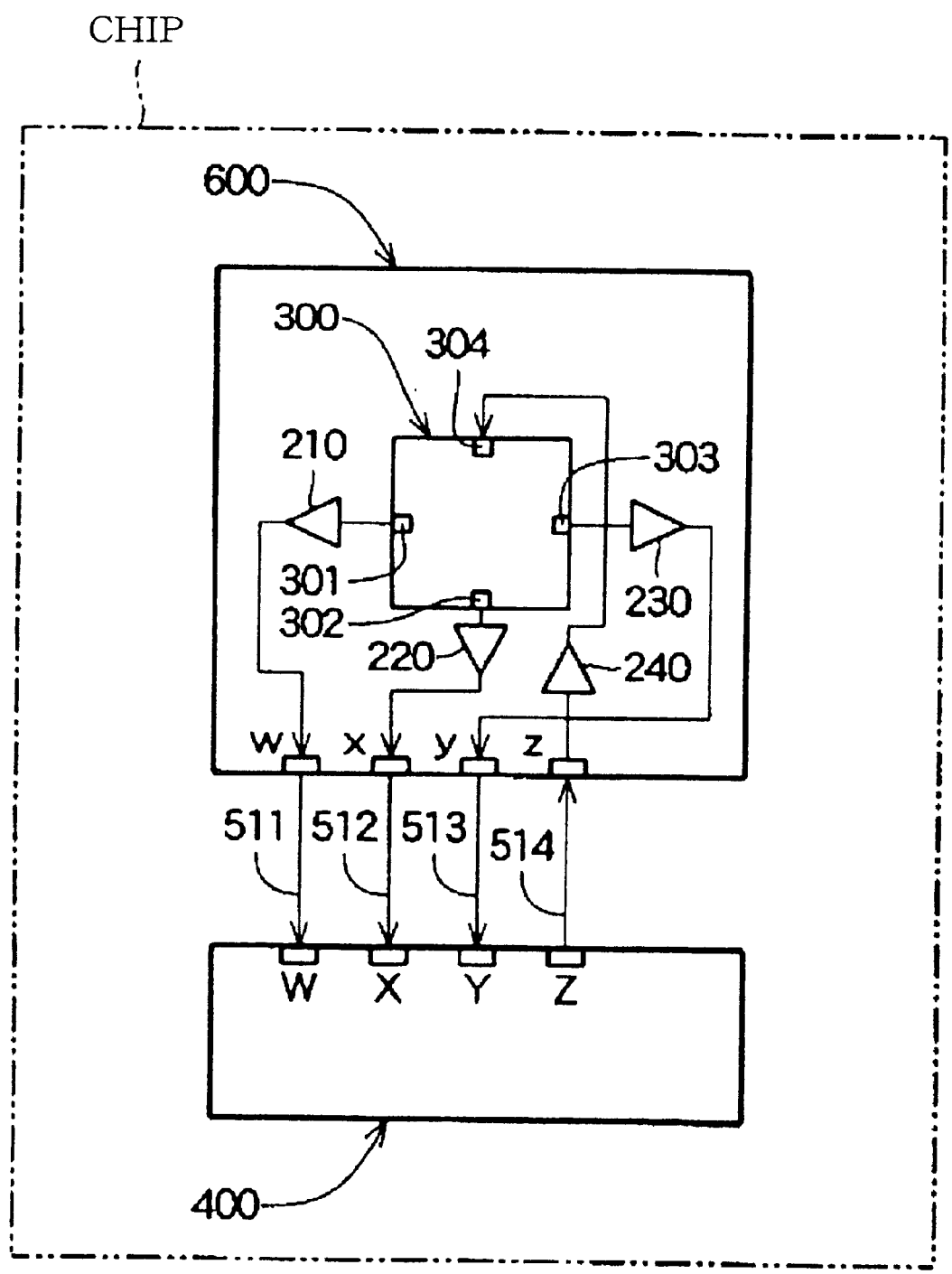
FIG. 17 shows a configuration of a macro cell designed for a logic core and used in combination with another macro cell designed for an IP core.

FIG. 14 shows a configuration of the macro cell shown in FIG. 13 used in combination with another macro cell. In FIG. 14, the other macro cell 2 is arranged at the right of the macro cell 8 and they are connected to each other by connecting the input terminal "ae" at the right side of the macro cell 8 and the output terminal "be" at the right side of the macro cell 8. In order to operate the macro cell 8, it is necessary to set a terminal to be used. The terminal to be used can be set by supplying a terminal selection data consisting of 6-bit serial data to the terminal selection data input terminal SDI in synchronization with the shift clock supplied to the shift clock input terminal SCK.

In this embodiment, the serial data (terminal selection data) supplied to select the terminals "ae" and "be" arranged at the right side of the macro cell 8 is "111000". In a state of 6-stage shift operation is performed, logical 1 is latched in the sixth-stage D-type flip-flop circuit FF6, logical 1 is latched in the fifth stage D-type flip-flop circuit FF5, logical 1 is latched in the fourth-stage D-type flip-flop circuit FF4, logical 0 is latched in the third-stage D-type flip-flop circuit FF3, logical 0 is latched in the second-stage D-type flip-flop circuit FF2, and logical 0 is latched in the first-stage D-type flip-flop circuit FF3. Since the data output Q from the fourth-stage D-type flip-flop circuit FF4 is logical 1, the tri-state buffer circuit 55 is controlled to be in an operation state and an output from the internal kernel circuit 11 is output from the output terminal "be" arranged at the right side. The data output Q from the fifth-stage and the sixth-stage D-type flip-flop circuits FF5 and FF6 are both logical 1. According to this 2-bit data, the multiplexer circuit 51 puts the switch circuit S4 in a conductive state. Accordingly, the signal supplied to the input terminal "ae" arranged at the right side is supplied to the input terminal "a" of the internal kernel circuit 11.

In the semiconductor device including the macro cells 6, 7, and 8 shown in FIG. 11 to FIG. 13, during initialization after power is turned on or prior to operating the macro cells 6, 7, and 8, the terminal selection data is supplied to set the terminal to be used. It is also possible to arrange an external terminal for supplying the terminal selection data so as to set the terminal to be used, from an external control circuit or the like. Moreover, the semiconductor device may have a built-in circuit for generating the terminal selection data. Furthermore, in a semiconductor device having a macro cell such as MPU and DSP, it is possible to generate a terminal selection data by program control.

As has been described above, in the semiconductor device according to the present invention, a terminal to be used is selected from a plurality of terminals having an identical function and arranged at different sides of the macro cell. This can increase the degree of freedom in the macro arrangement designing (floor plan). Moreover, by using a terminal arranged in the vicinity of the connection destination, it is possible to reduce the macro-connecting wire. Since a terminal selector is provided, it is possible to select only the terminal to be used and connect it to the terminal of the kernel circuit in the macro cell. Furthermore, since the wires to the respective terminals are isolated from one another, it is possible to minimize the signal delay due to the wiring, thereby enabling a high-speed operation.

Moreover, in the semiconductor device according to the present invention, terminals having an identical function are provided at least two of the sides of the macro cell and a terminal changer for selecting a terminal to be used according to the terminal specifying data is provided. Accordingly, it is possible to change the terminal to be used after a wire connection. Consequently, after preparing a semiconductor device having a plurality of wire routes for a single signal, it is possible to select an optimal wire route. Moreover, by supplying a test signal to a particular terminal and selecting the particular terminal, it is possible to perform an operation test of the macro cell.

The invention may be embodied in other specific forms without departing from the spirit or essential characteristic thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. 2000-138064 (Filed on May $11^{th}$, 2000) including specification, claims, drawings and summary are incorporated herein by reference in its entirety.

What is claimed is:

1. A semiconductor device including terminals having an identical function at least at two sides of a macro cell and a terminal changer for changing at least one of the terminals having the identical function according to a terminal specifying data, wherein the terminals having the identical function are input terminals, the terminal specifying data is supplied as a serial data, and the terminal changer has a shift register supplied with the serial data and an input selector circuit for selecting an input terminal according to the output from this shift register.

2. A semiconductor device including terminals having an identical function at least at two sides of a macro cell and a terminal selector for selecting at least one of the terminals having the identical function, wherein the terminals having the identical function are input terminals and the terminal selector is an AND circuit.

3. The semiconductor device as claimed in claim 2, wherein the AND circuit has input terminals connected to the plurality of terminals having the identical function and an output terminal connected to the input terminal of the kernel circuit in the macro cell.

4. The semiconductor device as claimed in claim 3, wherein input terminals not used among the plurality of input terminals having the identical function are fixed to logical 1.

5. The semiconductor device as claimed in claim 3, wherein the AND circuit has its input terminals pulled up.

6. A semiconductor device including terminals having an identical function at least at two sides of a macro cell and a terminal selector for selecting at least one of the terminals having the identical function, wherein the terminals having the identical function are input terminals and the terminal selector is composed of an OR circuit.

7. The semiconductor device as claimed in claim 6, wherein the OR circuit has its input terminals respectively connected to the plurality of terminals having the identical function and the OR circuit has its output terminal connected to the input terminal of the kernel circuit in the macro cell.

8. The semiconductor device as claimed in claim 7, wherein input terminals not used among the plurality of the terminals having the identical function are fixed to logical 0.

9. The semiconductor device as claimed in claim 7, wherein the OR circuit has its input terminal pulled down.

10. A semiconductor device including terminals having an identical function at least at two sides of a macro cell and a terminal changer for changing at least one of the terminals having the identical function according to a terminal specifying data, wherein the terminals having the identical function are input terminals, the terminal specifying data is supplied as parallel data, and the terminal changer has a data latch circuit for latching the parallel data and an input selector circuit for selecting an input terminal according to the terminal specifying data latched by this data latch circuit.

11. A semiconductor device including terminals having an identical function at least at two sides of a macro cell and a terminal changer for changing at least one of the terminals having the identical function according to a terminal specifying data, wherein the terminals having the identical function are output terminals, the terminal specifying data is supplied as a parallel data, and the terminal changer has a data latch circuit for latching the parallel data and an output selector circuit for selecting an output terminal according to the terminal specifying data latched by the data latch circuit.

12. The semiconductor device as claimed in claim 11, wherein the output selector circuit is composed of a tri-state buffer arranged for each of the output terminals so as to control the tri-state buffer corresponding to the output terminal specified according to the terminal specifying data, into an output enabled state.

13. A semiconductor device including terminals having an identical function at least at two sides of a macro cell and a terminal changer for changing at least one of the terminals having the identical function according to a terminal specifying data, wherein the terminals having the identical function are output terminals, the terminal specifying data is supplied as a serial data, and the terminal changer has a shift register supplied with the serial data, and an output selector circuit for selecting an output terminal according to the output from the shift register.

14. The semiconductor device as claimed in claim 13, wherein the output selector circuit is composed of a tri-state buffer arranged for each of the output terminals so as to control the tri-state buffer corresponding to the output terminal specified according to the terminal specifying data, into an output enabled state.

* * * * *